(12) United States Patent
Chang et al.

(10) Patent No.: US 12,089,402 B2
(45) Date of Patent: Sep. 10, 2024

(54) INTEGRATED CIRCUIT LAYOUT AND METHOD

(71) Applicant: TAIWAN SEMICONDUCTOR MANUFACTURING COMPANY, LTD., Hsinchu (TW)

(72) Inventors: Meng-Sheng Chang, Hsinchu (TW); Chien-Ying Chen, Hsinchu (TW); Chia-En Huang, Hsinchu (TW); Yih Wang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/346,700

(22) Filed: Jul. 3, 2023

(65) Prior Publication Data

US 2023/0354591 A1 Nov. 2, 2023

Related U.S. Application Data

(63) Continuation of application No. 17/740,316, filed on May 9, 2022, now Pat. No. 11,696,437, which is a
(Continued)

(51) Int. Cl.
*H10B 20/20* (2023.01)
*G06F 30/392* (2020.01)
(Continued)

(52) U.S. Cl.
CPC ........... *H10B 20/20* (2023.02); *G06F 30/392* (2020.01); *H01L 23/5226* (2013.01); *H01L 23/528* (2013.01)

(58) Field of Classification Search
CPC ............. H10B 20/20; H01L 27/11206; H01L 23/5226; H01L 23/528; G06F 30/392
(Continued)

(56) References Cited

U.S. PATENT DOCUMENTS 7,260,442 B2    8/2007   Hwang et al.
9,256,709 B2    2/2016   Yu et al.
(Continued)

FOREIGN PATENT DOCUMENTS

DE    10 2016 103 820    9/2016
DE    10 2019 101 570    8/2019

*Primary Examiner* — Tu-Tu V Ho
(74) *Attorney, Agent, or Firm* — Hauptman Ham, LLP

(57) ABSTRACT

A method of generating an IC layout diagram includes abutting first and second cells to define a first active region including first and second anti-fuse bits, abutting third and fourth cells to define a second active region including third and fourth anti-fuse bits, and defining a third active region including fifth and sixth anti-fuse bits adjacent to the first through fourth anti-fuse bits. The first cell includes first and second via regions overlapping first and second gate regions shared by respective structures and transistors of the first, third, and fifth anti-fuse bits, the fourth cell includes third and fourth via regions overlapping third and fourth gate regions shared by respective transistors and structures of the second, fourth, and sixth anti-fuse bits, the third cell includes fifth and sixth via regions overlapping the first gate region, and the second cell includes seventh and eighth via regions overlapping the fourth gate region.

20 Claims, 15 Drawing Sheets

Related U.S. Application Data continuation of application No. 17/025,563, filed on Sep. 18, 2020, now Pat. No. 11,342,341.

(60) Provisional application No. 62/955,671, filed on Dec. 31, 2019.

(51) Int. Cl.
*H01L 23/522* (2006.01)
*H01L 23/528* (2006.01)

(58) Field of Classification Search
USPC .......................................................... 257/530
See application file for complete search history.

(56) References Cited

U.S. PATENT DOCUMENTS

| | | |
|---|---|---|
| 9,324,457 B2 | 4/2016 | Takizawa |
| 10,726,914 B2 * | 7/2020 | Chung ............... G11C 13/0038 |
| 10,929,588 B2 | 2/2021 | Chang et al. |
| 2014/0040838 A1 | 2/2014 | Liu et al. |
| 2015/0278429 A1 | 10/2015 | Chang |
| 2016/0268243 A1 | 9/2016 | Lee et al. |

* cited by examiner

300A

| CA | CB1 | CA | CB1 |
|---|---|---|---|
| CB2 | CC | CB2 | CC |
| CA | CB1 | CA | CB1 |
| CB2 | CC | CB2 | CC |

| CA | CB1 | CA | CB1 |
|---|---|---|---|
| CB2 | CC | CB2 | CC |
| CA | CB1 | CA | CB1 |
| CB2 | CC | CB2 | CC |

| CB2 | CA | CB2 | CB2 | CA | CB2 |
|---|---|---|---|---|---|
| CB1 | CB1 | CC | CB1 | CB1 | CC |
| CB2 | CA | CB2 | CB2 | CA | CB2 |
| CB1 | CB1 | CC | CB1 | CB1 | CC |

| CB2 | CA | CB2 | CB2 | CA | CB2 |
|---|---|---|---|---|---|
| CB1 | CB2 | CC | CB1 | CB2 | CC |
| CB2 | CA | CB1 | CB2 | CA | CB1 |
| CB1 | CB2 | CC | CB1 | CB2 | CC |

610 — Apply a first voltage to a program line electrically connected to a gate structure included in anti-fuse structures of each of four adjacent anti-fuse bits 620 — Apply a second voltage to a bit line electrically connected to a first anti-fuse bit of the four adjacent anti-fuse bits, thereby causing a bit cell current to flow through the anti-fuse structure of the first anti-fuse bit, a current path of the bit cell current including four vias between the program line and the gate structure, each of the four vias being adjacent to an anti-fuse bit of the four adjacent anti-fuse bits 630 — Sense the cell current using a sense amplifier 640 — Repeat one or more of operations 610-630

FIG. 6

INTEGRATED CIRCUIT LAYOUT AND METHOD

PRIORITY CLAIM

The present application is a continuation of U.S. application Ser. No. 17/740,316, filed May 9, 2022, which is a continuation of U.S. application Ser. No. 17/025,563, filed Sep. 18, 2020, now U.S. Pat. No. 11,342,341, issued May 24, 2022, which claims the priority of U.S. Provisional Application No. 62/955,671, filed Dec. 31, 2019, which is incorporated herein by reference in its entirety.

BACKGROUND

Integrated circuits (ICs) sometimes include one-time-programmable ("OTP") memory elements to provide non-volatile memory ("NVM") in which data are not lost when the IC is powered off. One type of NVM includes an anti-fuse bit integrated into an IC by using a layer of dielectric material (oxide, etc.) connected to other circuit elements. To program an anti-fuse bit, a programming electric field is applied across the dielectric material layer to sustainably alter (e.g., break down) the dielectric material, thus decreasing the resistance of the dielectric material layer. Typically, to determine the status of an anti-fuse bit, a read voltage is applied across the dielectric material layer and a resultant current is read.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 3A-3D are diagrams of anti-fuse arrays, in accordance with some embodiments.

FIG. 6 is a flowchart of a method of operating an anti-fuse bit, in accordance with some embodiments.

DETAILED DESCRIPTION

Figure 1A:
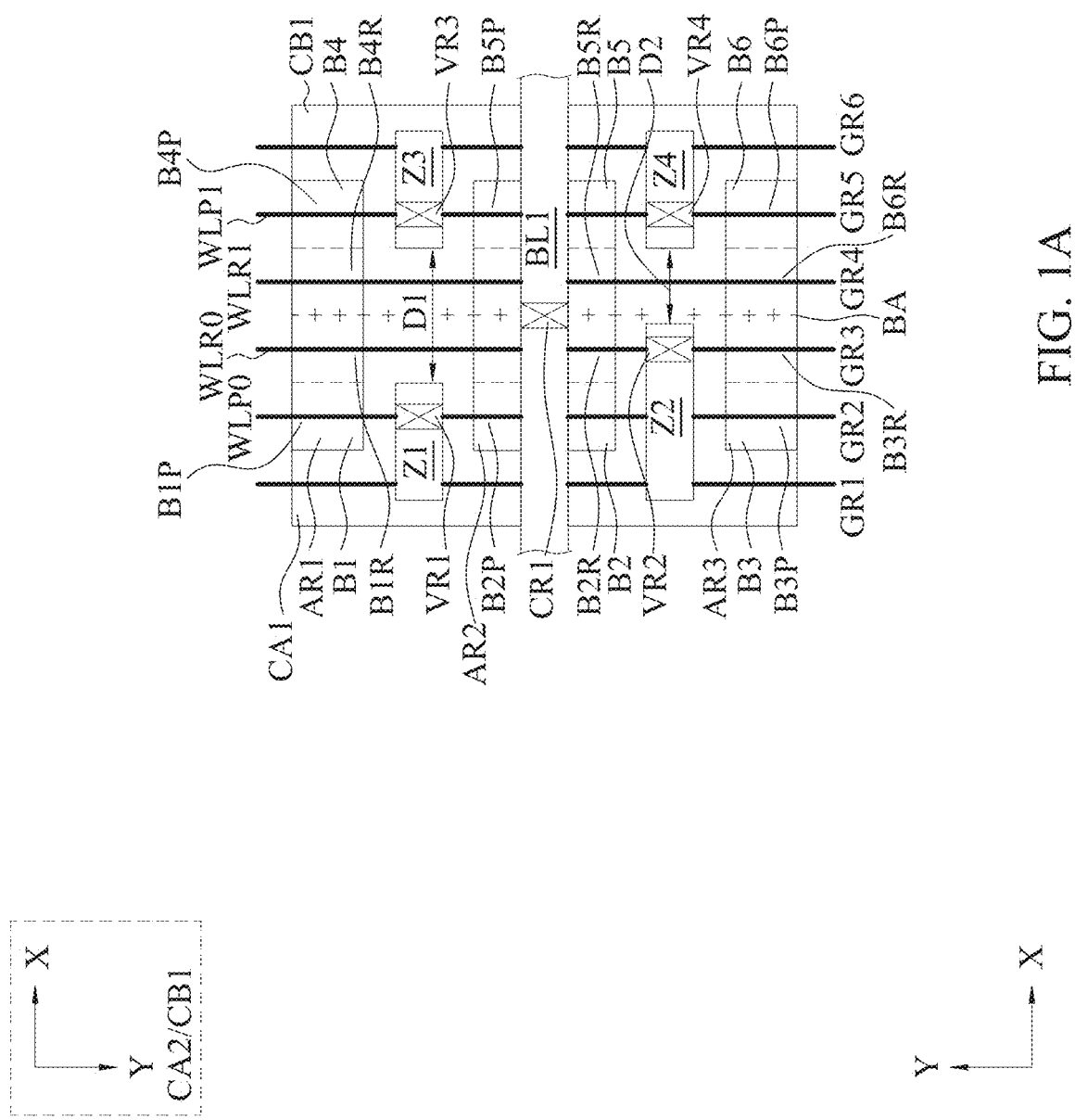
FIGS. 1A-1D are diagrams of anti-fuse layouts, in accordance with some embodiments.

The following disclosure provides many different embodiments, or examples, for implementing different features of the provided subject matter. Specific examples of components, materials, values, steps, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, an IC layout and an anti-fuse device manufactured based on the IC layout include four electrical connections between each active area corresponding to two anti-fuse bits and the two adjacent active areas. Compared to approaches in which fewer than four electrical connections are positioned between an active area corresponding to two anti-fuse bits and the adjacent active areas, an increased number of parallel current paths to a given anti-fuse bit reduces path resistance, thereby increasing current and improving performance in both programming and read operations.

Figure 1B:
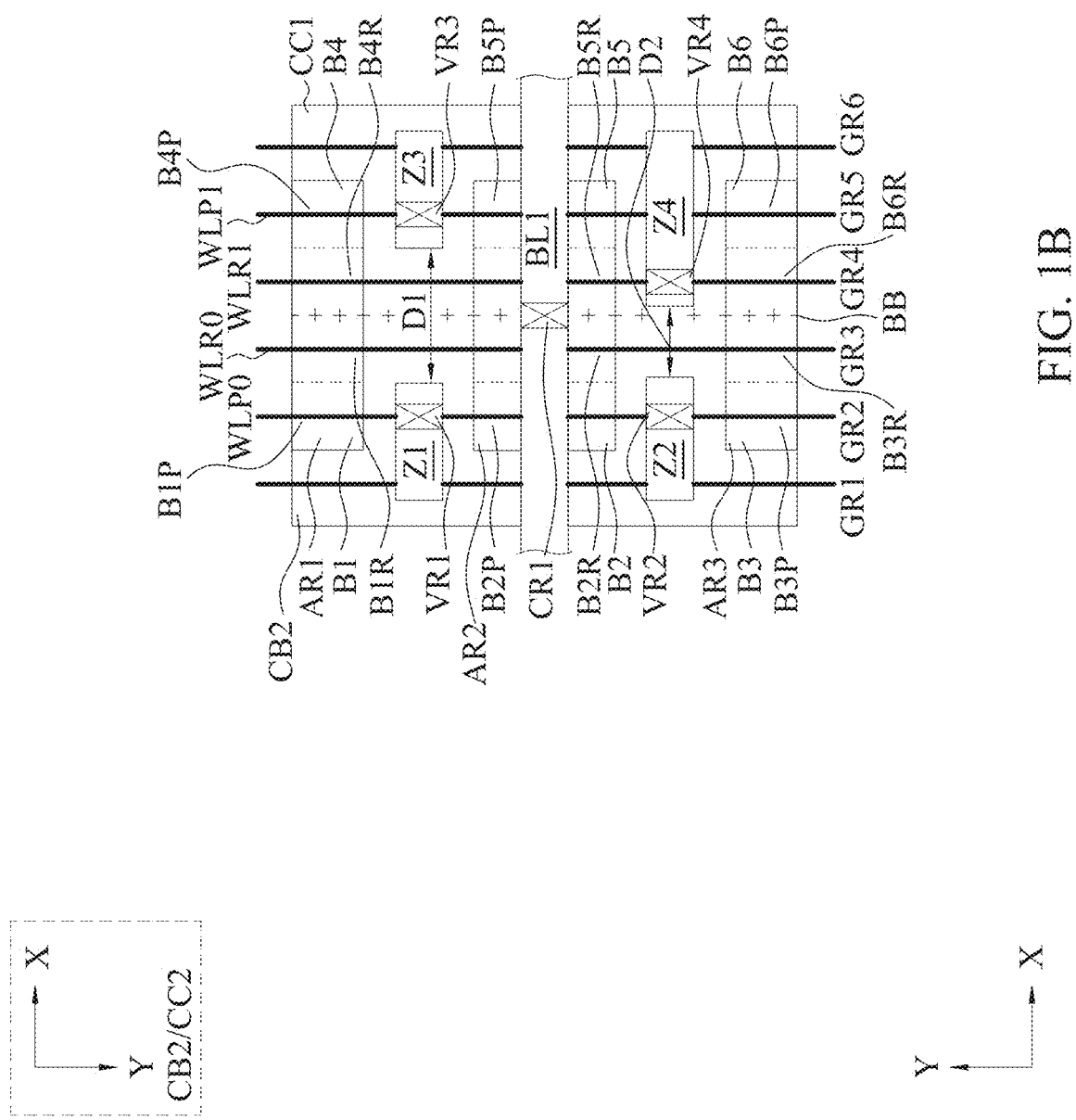
Figure 1C:
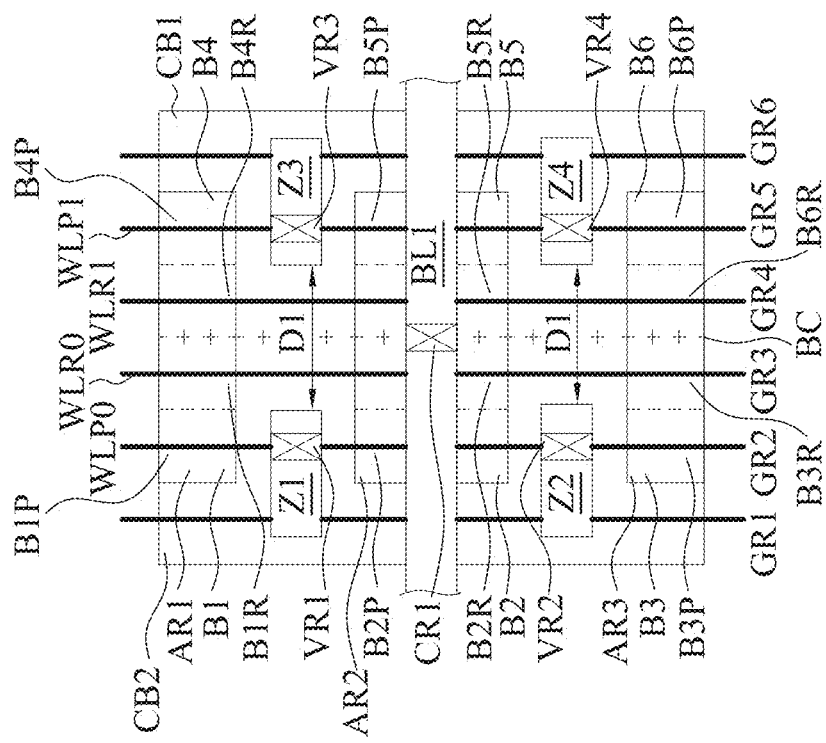

FIGS. 1A-1C are diagrams of anti-fuse layouts 100A-100C, in accordance with some embodiments. FIGS. 1A-1C depict plan views of respective anti-fuse layouts 100A-100C, an X direction, and a Y direction perpendicular to the X direction. Anti-fuse layout 100A includes a layout cell CA1 abutted with a layout cell CB1 along the X direction, thereby sharing a border BA extending in the Y direction; anti-fuse layout 100B includes a layout cell CB2 abutted with a layout cell CC1 along the X direction, thereby sharing a border BB extending in the Y direction; and anti-fuse layout 100C includes layout cell CB2 abutted with layout cell CB1 along the X direction, thereby sharing a border BC extending in the Y direction.

Each of anti-fuse layouts 100A and 100B includes an alternative embodiment indicated by an optionally inverted orientation for the Y direction. The alternative embodiment of anti-fuse layout 100A includes a layout cell CA2 corresponding to layout cell CA1 inverted in the Y direction, and the alternative embodiment of anti-fuse layout 100B includes a layout cell CC2 corresponding to layout cell CC1 inverted in the Y direction. Due to vertical symmetry considerations, layout cells CB1 and CB2 are not affected by the inversion in the Y direction.

An IC layout diagram, e.g., an IC layout diagram including an anti-fuse layout 100A-100C, is usable in a manufacturing process, e.g., an IC manufacturing flow associated with an IC manufacturing system 800 discussed below with respect to FIG. 8, as part of defining one or more features of an IC device, e.g., an IC device 500 discussed below with respect to FIGS. 5A-5C.

In various embodiments, a layout cell, e.g., layout cell CA1, CA2, CB1, CB2, CC1, or CC2, is a standalone cell, e.g., a standard cell stored in a cell library such as a cell library 707 discussed below with respect to FIG. 7, or is a part of a larger IC layout diagram, e.g., a standard cell or other circuit including features in addition to those depicted in FIGS. 1A-1C. In some embodiments, multiple layout cells, e.g., layout cells CA1(CA2)/CB1, CB2/CC1(CC2), or CB2/CB1, are stored as a single cell in a cell library. In some embodiments, a layout cell, e.g., layout cell CA1, CA2, CB1, CB2, CC1, or CC2, is included in an anti-fuse array, e.g., an anti-fuse layout 100, discussed below with respect to FIGS. 1D-1G.

Each of anti-fuse layouts 100A-100C includes a bit line BL1 extending in the X direction. In some embodiments, a portion of bit line BL1 intersecting a given layout cell is included in the corresponding layout cell CA1, CA2, CB1, CB2, CC1, or CC2. In some embodiments, the portion of bit line BL1 intersecting a given layout cell is not included in the corresponding layout cell CA1, CA2, CB1, CB2, CC1, or CC2, and is a component of anti-fuse layout 100A, 100B, or 100C separate from the given layout cell.

Each of anti-fuse layouts 100A-100C includes adjacent gate regions GR1-GR6 extending in the Y direction. In various embodiments, the portions of some or all of gate regions GR1-GR6 intersecting a given layout cell are either included in the corresponding layout cell CA1, CA2, CB1, CB2, CC1, or CC2, or not included in the corresponding layout cell CA1, CA2, CB1, CB2, CC1, or CC2 and are components of anti-fuse layout 100A, 100B, or 100C separate from the given layout cell.

Each of layout cells CA1, CA2, CB1, CB2, CC1, and CC2 includes portions of each of adjacent active regions AR1, AR2, and AR3 extending in the X direction. A layout cell CA1, CA2, or CB2 abutted with a layout cell CB1, CC1, or CC2 along the X direction collectively defines a combined portion of active region AR1, an entirety of active region AR2, and a combined portion of active region AR3. In various embodiments, a layout cell CA1, CA2, or CB2 abutted with a layout cell CB1, CC1, or CC2 are collectively abutted with layout cells (not shown) in addition to the layout cell CA1, CA2, or CB2 and the layout cell CB1, CC1, or CC2, and thereby collectively define entireties of one or both of active regions AR1 or AR3.

An active region, e.g., an active region AR1, AR2, or AR3, is a region in an IC layout diagram, e.g., an IC layout diagram including an anti-fuse layout 100A-100C, included in a manufacturing process as part of defining an active area, also referred to as an oxide diffusion or definition (OD), in a semiconductor substrate in which one or more IC device features, e.g., a source/drain region, is formed. In various embodiments, an active area is an n-type or p-type active area of a planar transistor or a fin, field-effect transistor (FinFET). In some embodiments, an active region is included in a manufacturing process as part of defining an active area AA1-AA4 discussed below with respect to FIGS. 5A-5C.

A gate region, e.g., a gate region GR1-GR6, is a region in an IC layout diagram, e.g., an IC layout diagram including anti-fuse layout 100A-100C, included in the manufacturing process as part of defining a gate structure in the IC device including at least one of a conductive material or a dielectric material. In various embodiments, one or more gate structures corresponding to gate regions GR1-GR6 includes at least one conductive material overlying at least one dielectric material. In some embodiments, a gate region is included in a manufacturing process as part of defining a gate structure G2-G5 discussed below with respect to FIGS. 5A-5C.

In the embodiments depicted in FIGS. 1A-1C, each gate region GR2-GR5 intersects each active region AR1, AR2, and AR3. In various embodiments, one or more of gate regions GR2-GR5 does not intersect one or more of active regions AR1 or AR3, or one or more gate regions (not shown) in addition to gate regions GR2-GR5 intersects one or more of active regions AR1, AR2, or AR3.

In the embodiments depicted in FIGS. 1A-1C, each gate region GR1 and GR6 does not intersect any of active regions AR1, AR2, or AR3. In some embodiments, gate regions GR1 and GR6 are referred to as dummy gate regions corresponding to dummy gate structures of an IC device. In various embodiments, one or more of gate regions GR1 or GR6 intersects or abuts one or more of active regions AR1, AR2, or AR3. In various embodiments, layout cell CA1, CA2, or CB2 includes one or more gate regions (not shown) in addition to gate regions GR1-GR3, and/or layout cell CA1, CA2, or CB2 does not include one or more of gate regions GR1-GR3. In various embodiments, layout cell CB1, CC1, or CC2 includes one or more gate regions (not shown) in addition to gate regions GR4-GR6, and/or layout cell CB1, CC1, or CC2 does not include one or more of gate regions GR4-GR6.

Each of layout cells CA1, CA2, and CB2 includes a conductive region Z1 extending in the X direction between active regions AR1 and AR2, and a conductive region Z2 extending in the X direction between active regions AR2 and AR3. Each of layout cells CB1, CC1, and CC2 includes a conductive region Z3 extending in the X direction between active regions AR1 and AR2, and a conductive region Z4 extending in the X direction between active regions AR2 and AR3. Conductive region Z1 is aligned with conductive region Z3 in the X direction, and conductive region Z2 is aligned with conductive region Z4 in the X direction.

A conductive region, e.g., bit line BL1 or a conductive region Z1-Z4, is a region in an IC layout diagram, e.g., an IC layout diagram including anti-fuse layout 100A-100C, included in the manufacturing process as part of defining one or more segments of one or more conductive layers in an IC device. In various embodiments, one or more of conductive regions Z1-Z4 or bit line BL1 corresponds to one or more segments of a same or different conductive layers in the IC device. In various embodiments, one or more of conductive regions Z1-Z4 or bit line BL1 corresponds to one or more of a first metal layer, a second metal layer, or a higher metal layer in the IC device. In some embodiments, one or more of conductive regions Z1-Z4 or bit line BL1 corresponds to a metal layer referred to as a metal zero layer in the IC device. In some embodiments, a conductive region, e.g., a conductive region Z1-Z4 or bit line BL1, is included in a manufacturing process as part of defining a conductive segment M11-M18 or M21-M24 or a bit line MBL1-MBL4 discussed below with respect to FIGS. 5A-5C.

In each of anti-fuse layouts 100A-100C, conductive region Z1 intersects gate regions GR1 and GR2, and a via region VR1 is positioned at the location at which conductive region Z1 intersects gate region GR2.

In anti-fuse layout 100A, conductive region Z2 intersects each of gate regions GR1-GR3, and a via region VR2 is positioned at the location at which conductive region Z2 intersects gate region GR3. In some embodiments, in anti-fuse layout 100A, conductive region Z2 intersects gate regions GR2 and GR3 and does not intersect gate region GR1. In anti-fuse layouts 100B and 100C, conductive region Z2 intersects gate regions GR1 and GR2, and via region VR2 is positioned at the location at which conductive region Z2 intersects gate region GR2.

In each of anti-fuse layouts 100A-100C, conductive region Z3 intersects gate regions GR5 and GR6, and a via region VR3 is positioned at the location at which conductive region Z3 intersects gate region GR5.

In anti-fuse layouts 100A and 100C, conductive region Z4 intersects gate regions GR5 and GR6, and a via region VR4 is positioned at the location at which conductive region Z4 intersects gate region GR5. In anti-fuse layout 100B, conductive region Z4 intersects each of gate regions GR4-GR6, and via region VR4 is positioned at the location at which conductive region Z4 intersects gate region GR4. In some embodiments, in anti-fuse layout 100B, conductive region Z4 intersects gate regions GR4 and GR5 and does not intersect gate region GR6.

A via region, e.g., a via region VR1-VR4, is a region in an IC layout diagram, e.g., an IC layout diagram including anti-fuse layout 100A-100C, included in the manufacturing process as part of defining one or more segments of one or more conductive layers in the IC device configured to form an electrical connection between a conductive layer segment corresponding to a conductive region and a gate structure corresponding to a gate region or another conductive layer segment corresponding to another conductive region. In various embodiments, the one or more conductive layer segments formed based on a via region includes a via between a gate structure or segment in a given metal layer and a segment in an overlying metal layer of the IC device. In some embodiments, a via region corresponds to a slot via or square via in the IC device. In some embodiments a via region is included in a manufacturing process as part of defining a via V11-V18 or V21-V28 discussed below with respect to FIGS. 5A-5C.

In each of anti-fuse layouts 100A-100C, bit line BL1 intersects active region AR2, and a contact region CR1 is positioned within active region AR2 between gate regions GR3 and GR4 and along the border BA, BB, or BC between a layout cell CA1, CA2, or CB2 and a layout cell CB1, CC1, or CC2. In various embodiments, one or more of anti-fuse layouts 100A-100C includes one or more bit lines (not shown) and one or more contact regions (not shown) in addition to bit line BL1 and contact region CR1, e.g., a bit line and contact region intersecting active region AR1 or AR3.

A contact region, e.g., contact region CR1, is a region in an IC layout diagram, e.g., an IC layout diagram including anti-fuse layout 100A-100C, included in the manufacturing process as part of defining one or more segments of one or more conductive layers in the IC device configured to form an electrical connection between a segment corresponding to a conductive region, e.g., bit line BL1, and an active area corresponding to an active region, e.g., active region AR2. In various embodiments, the one or more conductive layer segments formed based on a contact region includes a contact between the corresponding active area and conductive segment of the IC device. In some embodiments, a contact region is included in a manufacturing process as part of defining a contact C1-C4 discussed below with respect to FIGS. 5A-5C.

By the configuration discussed above, an IC device manufactured based on an anti-fuse layout 100A-100C includes anti-fuse bits B2 and B5 positioned within the active area based on active region AR2. Anti-fuse bit B2 includes an anti-fuse structure B2P having a gate (also referred to as B2P) positioned at a location defined by the intersection of active region AR2 and gate region GR2, and a transistor B2R having a gate (also referred to as B2R) positioned at a location defined by the intersection of active region AR2 and gate region GR3. Anti-fuse bit B5 includes an anti-fuse structure B5P having a gate (also referred to as B5P) positioned at a location defined by the intersection of active region AR2 and gate region GR5 and a transistor B5R having a gate (also referred to as B5R) positioned at a location defined by the intersection of active region AR2 and gate region GR4.

In embodiments in which an anti-fuse layout 100A-100C is abutted with layout cells adjacent to active region AR1, an IC device manufactured based on the anti-fuse layout 100A-100C and the adjacent layout cells includes anti-fuse bits B1 and B4 positioned within the active area based on active region AR1. Anti-fuse bit B1 includes an anti-fuse structure B1P having a gate (also referred to as B1P) positioned at a location defined by the intersection of active region AR1 and gate region GR2, and a transistor B1R having a gate (also referred to as B1R) positioned at a location defined by the intersection of active region AR1 and gate region GR3. Anti-fuse bit B4 includes an anti-fuse structure B4P having a gate (also referred to as B4P) positioned at a location defined by the intersection of active region AR1 and gate region GR5 and a transistor B4R having a gate (also referred to as B4R) positioned at a location defined by the intersection of active region AR1 and gate region GR4.

In embodiments in which an anti-fuse layout 100A-100C is abutted with layout cells adjacent to active region AR3, an IC device manufactured based on the anti-fuse layout 100A-100C and the adjacent layout cells includes anti-fuse bits B3 and B6 positioned within the active area based on active region AR3. Anti-fuse bit B3 includes an anti-fuse structure B3P having a gate (also referred to as B3P) positioned at a location defined by the intersection of active region AR3 and gate region GR2, and a transistor B3R having a gate (also referred to as B3R) positioned at a location defined by the intersection of active region AR3 and gate region GR3. Anti-fuse bit B6 includes an anti-fuse structure B6P having a gate (also referred to as B6P) positioned at a location defined by the intersection of active region AR3 and gate region GR5 and a transistor B6R having a gate (also referred to as B6R) positioned at a location defined by the intersection of active region AR3 and gate region GR4.

For each of anti-fuse structures B1P-B6P, at least a portion of the gate structure based on the corresponding gate region GR2 or GR5 and overlying the active area based on the corresponding active region AR1-AR3 corresponds to a gate including a layer of one or more dielectric materials configured so that, in operation, a sufficiently large electric field across the dielectric layer sustainably alters a dielectric material, thereby significantly decreasing the resistance of the dielectric layer from a level prior to application of the electric field. Sustainably altering the dielectric material is also referred to as breaking down the dielectric material, in some embodiments. In some embodiments, one or more of anti-fuse structures B1P-B6P is referred to as a programming transistor.

Transistors B1R-B6R are electrically connected to respective anti-fuse structures B1P-B6P through active area portions based on corresponding active regions AR1-AR3 between gate regions GR2 and GR3 or between gate regions GR4 and GR5, accordingly. Transistors B1R-B6R are electrically connected to one or more segments based on corresponding bit lines, e.g., bit line BL1, through active area portions based on corresponding active regions AR1-AR3 between gate regions GR3 and GR4 in series with the one or more conductive segments corresponding to contact region CR1.

The gate structure corresponding to gate region GR2 is thereby configured as a terminal of each of anti-fuse structures B1P-B3P, the gate structure corresponding to gate region GR3 is thereby configured as the gate of each of transistors B1R-B3R, the gate structure corresponding to gate region GR4 is thereby configured as the gate of each of transistors B4R-B6R, and the gate structure corresponding to gate region GR5 is thereby configured as a terminal of each of anti-fuse structures B4P-B6P.

In each of anti-fuse layouts 100A-100C, conductive region Z1 and via region VR1 define a location of an electrical connection to each of anti-fuse structures B1P-B3P through the gate structure corresponding to gate region GR2.

In anti-fuse layout 100A, conductive region Z2 and via region VR2 define a location of an electrical connection to each of transistors B1R-B3R through the gate structure corresponding to gate region GR3. In anti-fuse layouts 100B and 100C, conductive region Z2 and via region VR2 define a location of an electrical connection to each of anti-fuse structures B1P-B3P through the gate structure corresponding to gate region GR2.

In each of anti-fuse layouts 100A-100C, conductive region Z3 and via region VR3 define a location of an electrical connection to each of anti-fuse structures B4P-B6P through the gate structure corresponding to gate region GR5.

In anti-fuse layouts 100A and 100C, conductive region Z4 and via region VR4 define a location of an electrical connection to each of anti-fuse structures B4P-B6P through the gate structure corresponding to gate region GR5. In anti-fuse layout 100B, conductive region Z4 and via region VR4 define a location of an electrical connection to each of transistors B4R-B6R through the gate structure corresponding to gate region GR4.

In each of anti-fuse layouts 100A-100C, conductive regions Z1 and Z3 are separated by a distance D1 in the X direction. In anti-fuse layouts 100A and 100B, conductive regions Z2 and Z4 are separated by a distance D2 in the X direction, and in anti-fuse layout 100C, conductive regions Z2 and Z4 are separated by distance D1.

Each of distances D1 and D2 has a value greater than or equal to a predetermined distance based on one or more design rules for the conductive layer that includes conductive regions Z1-Z4, and thereby corresponds to the one or more design rules. In various embodiments, the predetermined distance is based on one or a combination of a minimum spacing rule for a metal layer, e.g., a first metal layer, or a minimum spacing rule for a circuit design-based voltage difference between conductive regions Z1 and Z3 or between conductive regions Z2 and Z4. In a non-limiting example, a minimum spacing rule for a circuit design-based voltage difference is a minimum distance between two conductors configured so that one of the two conductors is capable of carrying a power supply voltage level and the other of the two conductors is capable of carrying a reference or ground voltage level.

In some embodiments, one or both of distances D1 or D2 has a value greater than or equal to a minimum spacing rule based on one or more manufacturing process limitations. In some embodiments, the minimum spacing rule is based on a wavelength of an electromagnetic wave used in one or more lithography operations of a manufacturing process. In some embodiments, the minimum spacing rule is based on an extreme ultraviolet (EUV) manufacturing process. In some embodiments, an EUV manufacturing process corresponds to a wavelength ranging from 12 nanometers (nm) to 15 nm. In some embodiments, an EUV manufacturing process corresponds to a wavelength approximately equal to 13.5 nm.

In the embodiments depicted in FIGS. 1A-1C, distance D1 is larger than distance D2. In various embodiments, distance D1 is the same as or smaller than distance D2.

In the embodiments depicted in FIGS. 1A-1C, distance D1 is sufficiently large such that the corresponding conductive region Z1 or Z2 does not intersect gate region GR3, and the corresponding conductive region Z3 or Z4 does not intersect gate region GR4. In various embodiments, distance D1 corresponds to one or both of the corresponding conductive region Z1 or Z2 intersecting gate region GR3 or the corresponding conductive region Z3 or Z4 intersecting gate region GR4.

Distance D2 is sufficiently small such that either conductive region Z2 intersects gate region GR3 and conductive region Z4 intersects gate region GR5, or conductive region Z2 intersects gate region GR2 and conductive region Z4 intersects gate region GR4.

In an IC device manufactured based on anti-fuse layouts 100A-100C, a total number of electrical connections to anti-fuse structures B1P-B6P and transistors B1R-B6R is based on two via-gate structure connections between each pair of adjacent active areas in which anti-fuse bits B1-B6 are located. A total of four electrical connections are thereby located between the two active areas adjacent to an active area corresponding to two anti-fuse bits. Compared to approaches in which a total of one via-gate structure connection is located between adjacent active areas, an IC device manufactured based on anti-fuse layouts 100A-100C is thereby capable of including an increased number of electrical connections per anti-fuse bit. Based on the increased number of parallel current paths to a given anti-fuse bit, path resistance is reduced and currents are increased, thereby improving performance in both programming and read operations as further discussed below.

Figure 1D:
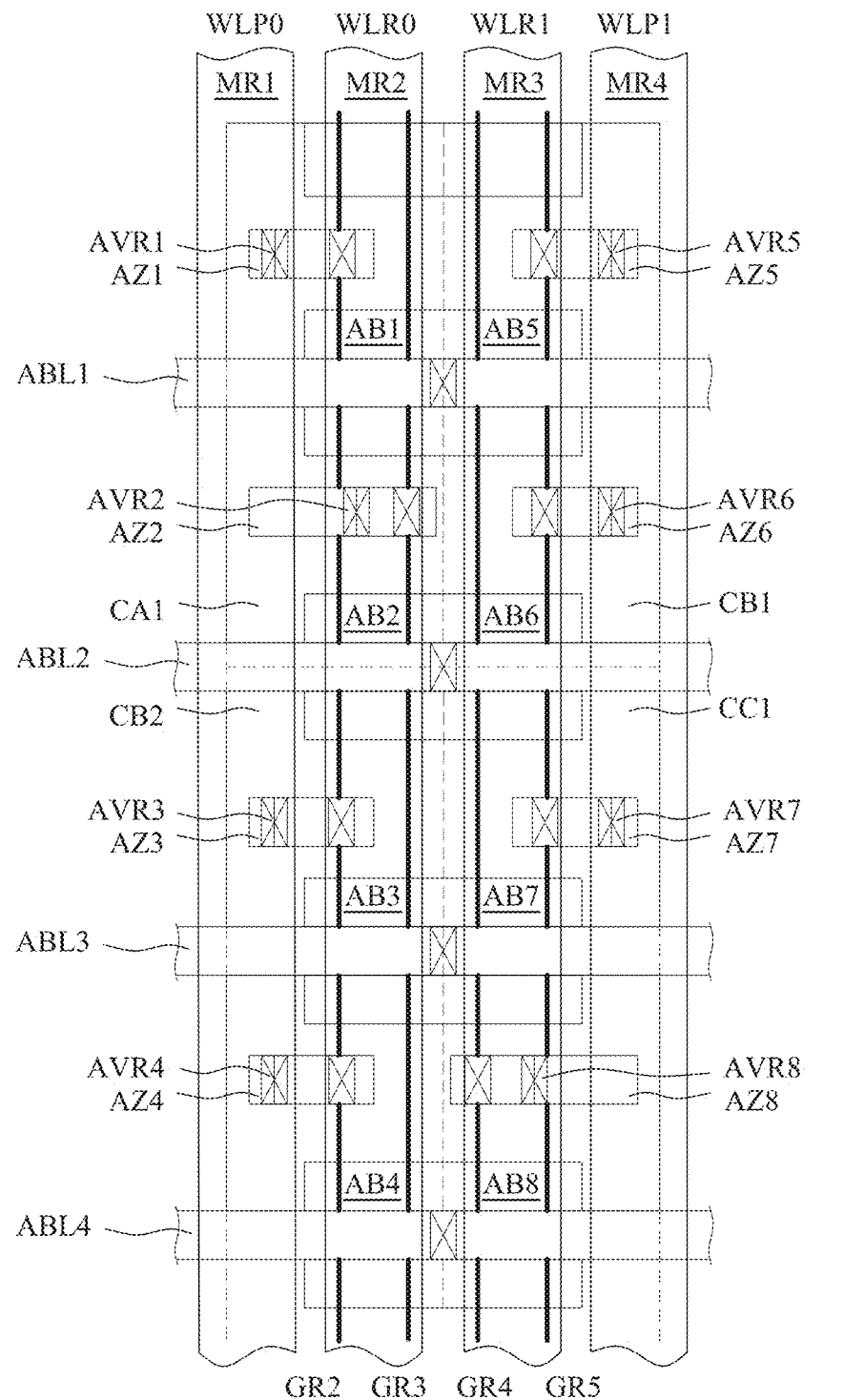

FIG. 1D is a diagram of anti-fuse layout 100, in accordance with some embodiments. Anti-fuse layout 100 is a non-limiting example of a layout of an anti-fuse array based on a combination of anti-fuse layouts 100A-100C. As depicted in FIG. 1D, anti-fuse layout 100, based on anti-fuse layouts 100A and 100B, includes layout cell CA1 abutted with layout cell CB1 along the X direction, and layout cells CA1 and CB1 collectively abutted with layout cells CB2 and CC1 in the Y direction. Details of layout cells CA1, CB1, CB2, and CC1 are omitted for clarity.

Based on the configuration of layout cells CA1, CB1, CB2, and CC1, two layout cells (not labeled) adjacent to layout cells CB2 and CC1 in the negative Y direction, and gate regions GR2-GR5, anti-fuse layout 100 corresponds to anti-fuse bits AB1-AB8, each an instance of an anti-fuse bit B1-B6. A bit line ABL1 is associated with anti-fuse bits AB1 and AB5, a bit line ABL2 is associated with anti-fuse bits AB2 and AB6, a bit line ABL3 is associated with anti-fuse bits AB3 and AB7, and a bit line ABL4 is associated with anti-fuse bits AB4 and AB8. Conductive regions AZ1-AZ8 correspond to instances of conductive regions Z1-Z4 of anti-fuse layouts 100A-100C.

Anti-fuse layout 100 includes conductive regions MR1-MR4, each extending in the Y direction. Conductive region MR1 intersects each of conductive regions AZ1-AZ4, and via regions AVR1, AVR3, and AVR4 are positioned at the locations at which conductive region MR1 intersects conductive regions AZ1, AZ3, and AZ4, respectively. Conductive region MR2 intersects each of conductive regions AZ1-AZ4, and a via region AVR2 is positioned at the location at which conductive region MR2 intersects conductive region AZ2. Conductive region MR3 intersects each of conductive regions AZ5-AZ8, and a via region AVR8 is positioned at the location at which conductive region MR3 intersects conductive region AZ8. Conductive region MR4 intersects each of conductive regions AZ5-AZ8, and via regions AVR5-AVR7 are positioned at the locations at which conductive region MR4 intersects conductive regions AZ5-AZ7, respectively.

In the embodiment depicted in FIG. 1D, anti-fuse layout 100 includes conductive regions MR1-MR4, gate regions GR2-GR5, and bit lines ABL1-ABL4 corresponding to a total of eight anti-fuse bits AB1-AB8. In various embodiments, anti-fuse layout 100 includes conductive regions MR1-MR4 and gate regions GR2-GR5 extending in the positive and/or negative Y direction, thereby corresponding to anti-fuse bits (not shown) in addition to anti-fuse bits AB1-AB8. In various embodiments, anti-fuse layout 100 includes bit lines ABL1-ABL4 extending in the positive and/or negative X direction, thereby corresponding to anti-fuse bits (not shown) in addition to anti-fuse bits AB1-AB8.

An IC device, e.g., an anti-fuse array, manufactured based on anti-fuse layout 100 is thereby configured such that a conductive segment based on conductive region MR1 is electrically connected to terminals of anti-fuse structures of each of anti-fuse bits AB1-AB4 through at least three current paths corresponding to conductive regions AZ1, AZ3, and AZ4, and a conductive segment based on conductive region MR2 is electrically connected to gates of transistors of each of anti-fuse bits AB1-AB4 through at least one current path corresponding to conductive region AZ2. A conductive segment based on conductive region MR3 is thereby electrically connected to gates of transistors of each of anti-fuse bits AB5-AB8 through at least one current path corresponding to conductive region AZ8, and a conductive segment based on conductive region MR4 is electrically connected to terminals of anti-fuse structures of each of anti-fuse bits AB5-AB8 through at least three current paths corresponding to conductive regions AZ5-AZ7.

The gate structure corresponding to gate region GR2 is thereby configured as the terminal of each of the anti-fuse structures of anti-fuse bits AB1-AB4 and is responsive to a signal WLP0 received on the segment corresponding to conductive region MR1. The gate structure corresponding to gate region GR3 is thereby configured as the gate of each of the transistors of anti-fuse bits AB1-AB4 and is responsive to a signal WLR0 received on the segment corresponding to conductive region MR2. The gate structure corresponding to gate region GR4 is thereby configured as the gate of each of the transistors of anti-fuse bits AB5-AB8 and is responsive to a signal WLR1 received on the segment corresponding to conductive region MR3. The gate structure corresponding to gate region GR5 is thereby configured as the terminal of each of the anti-fuse structures of anti-fuse bits AB5-AB8 and is responsive to a signal WLP1 received on the segment corresponding to conductive region MR4. Signals WLP0, WLR0, WLR1, and WLP1 and anti-fuse bits AB1-AB8 are discussed below with respect to FIGS. 1E-1G.

Figure 1E:
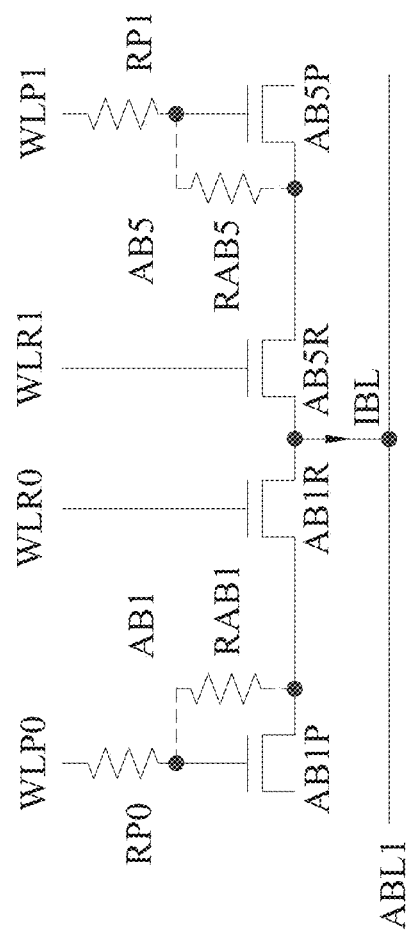
FIGS. 1E-1G are schematic diagrams of portions of an anti-fuse array, in accordance with some embodiments.

FIG. 1E is a schematic diagram of a portion of anti-fuse layout 100 corresponding to anti-fuse bits AB1 and AB5, in accordance with some embodiments. As depicted in FIG. 1E, bit line ABL1 is electrically connected to first source/drain terminals of each of a transistor AB1R of anti-fuse bit AB1 and a transistor AB5R of anti-fuse bit AB5 in the corresponding active area portion between gate regions GR3 and GR4. The second source/drain terminal of transistor AB1R is electrically connected to a source/drain terminal of an anti-fuse structure AB1P of anti-fuse bit AB1 in the corresponding active area portion between gate regions GR2 and GR3, and the second source/drain terminal of transistor AB5R is electrically connected to a source/drain terminal of an anti-fuse structure AB5P of anti-fuse bit AB5 in the corresponding active area portion between gate regions GR4 and GR5.

The gate structure portion corresponding to gate region GR2 between anti-fuse bit AB1 and one of conductive regions AZ1 or AZ2 is represented as a resistor RP0, and the gate structure portion corresponding to gate region GR5 between anti-fuse bit AB5 and one of conductive regions AZ5 or AZ6 is represented as a resistor RP1.

In programming and read operations on anti-fuse bit AB1, signal WLP0 is applied to anti-fuse structure AB1P through resistor RP0, transistor AB1R is turned on responsive to signal WLR0 applied through the gate structure corresponding to gate region GR3, and a reference voltage is applied to bit line ABL1. In programming and read operations on anti-fuse bit AB5, signal WLP1 is applied to anti-fuse structure AB5P through resistor RP1, transistor AB5R is switched on responsive to signal WLR1 applied through the gate structure corresponding to gate region GR4, and the reference voltage level is applied to bit line ABL1.

In programming and read operations on either of anti-fuse bits AB1 or AB5, a current IBL flows to bit line ABL1. Magnitudes and polarities of current IBL are based on magnitudes and polarities of signals WLP0 and WLP1 relative to the reference voltage applied to bit line ABL1, and on path resistance values presented either by the series of resistor RP0, anti-fuse structure AB1P, and transistor AB1R, or by the series of resistor RP1, anti-fuse structure AB5P, and transistor AB5R.

In the embodiment depicted in FIG. 1E, anti-fuse structures AB1P and AB5P and transistors AB1R and AB5R are NMOS devices, transistors AB1R and AB5R thereby being configured to be switched on in response to a respective signal WLR0 or WLR1 having a sufficiently large positive value relative to the reference voltage level. In some embodiments, anti-fuse structures AB1P and AB5P and transistors AB1R and AB5R are PMOS devices, transistors AB1R and AB5R thereby being configured to be switched on in response to a respective signal WLR0 or WLR1 having a sufficiently large negative value relative to the reference voltage level.

In a programming operation, signal WLP0 or WLP1 has a programming voltage level such that a difference between the programming voltage level and the reference voltage level produces an electric field across the dielectric layer of the gate of the corresponding anti-fuse structure AB1P or AB5P sufficiently large to sustainably alter the dielectric material, the resultant lowered resistance being represented in FIG. 1E as a respective resistor RAB1 or RAB5.

In a read operation, signal WLP0 or WLP1 has a read voltage level such that a difference between the read voltage level and the reference voltage level produces an electric field that is sufficiently small to avoid sustainably altering the dielectric material of the corresponding anti-fuse structure AB1P or AB5P, and sufficiently large to generate current IBL having a magnitude capable of being sensed by a sense amplifier (not shown) and thereby used to determine a programmed status of the corresponding anti-fuse structure AB1P or AB5P.

In various embodiments, one or both of the programming or read voltage levels is either positive relative to the reference voltage level or negative relative to the reference voltage level.

Figure 1F:
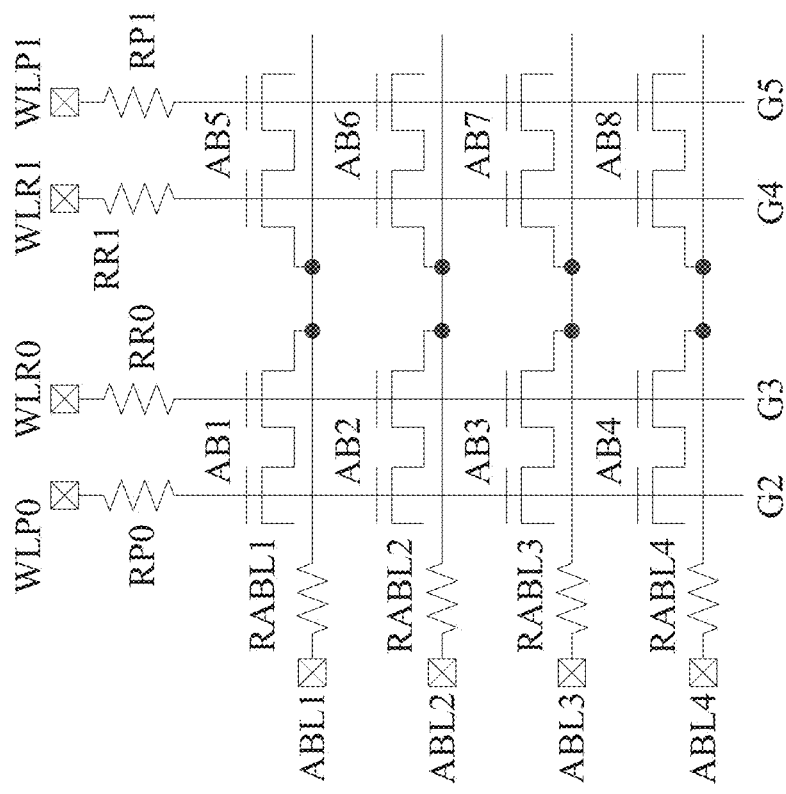

FIG. 1F is a schematic diagram of a portion of anti-fuse layout 100 corresponding to anti-fuse bits AB1-AB8, in accordance with some embodiments. FIG. 1F includes signals WLP0, WLR0, WLR1, and WLP1, resistors RP0 and RP1, bit lines ABL1-ABL4, and anti-fuse bits AB1-AB8, discussed above with respect to FIGS. 1D and 1E, and gate structures G2-G5 based on respective gate regions GR2-GR5 discussed above with respect to FIGS. 1A-1D.

FIG. 1F also includes resistors RR0, RR1, and RABL1-RABL4. Resistor RR0 represents the portion of gate structure G3 between a given one of anti-fuse bits AB1-AB4 and conductive region AZ2, resistor RR1 represents the portion of gate structure G4 between a given one of anti-fuse bits AB5-AB8 and conductive region AZ8, and each resistor RABL1-RABL4 represents one or more conductive segments corresponding to a respective one of bit lines ABL1-ABL4.

As discussed above with respect to FIG. 1E, resistor RP0 represents the length of the portion of gate structure G2 between anti-fuse bit AB1 and one of conductive regions AZ1 or AZ2, and resistor RP1 represents the length of the portion of gate structure G5 between anti-fuse bit AB5 and one of conductive regions AZ5 or AZ6. In the embodiment depicted in FIGS. 1F and 1G, each portion of gate structure G2 between anti-fuse bits AB1-AB4 and a nearest conductive region AZ1, AZ3, or AZ4 has a same length such that resistor RP0 has a same value for each anti-fuse bit AB1-AB4, and each portion of gate structure G5 between anti-fuse bits AB5-AB8 and a nearest conductive region AZ5-AZ7 has a same length such that resistor RP1 has a same value for each anti-fuse bit AB1-AB4.

Based on the layout of anti-fuse layout 100, in at least some cases, a length of a gate structure portion between a given one of anti-fuse bits AB1-AB8 and a nearest conductive region AZ2 or AZ8 is different from one or more lengths of gate structure portions between another one or more of anti-fuse bits AB1-AB8 and a nearest conductive region AZ2 or AZ8. In such cases, corresponding resistors RR0 and/or RR1 have nominal values that differ based on the differing lengths.

In some embodiments, in at least some cases, a length of a gate structure portion between a given one or more of anti-fuse bits AB1-AB8 and a nearest conductive region AZ2 or AZ8 is the same as a length of one or more gate structure portions between another one or more of anti-fuse bits AB1-AB8 and a nearest conductive region AZ2 or AZ8. In such cases, corresponding resistors RR0 and/or RR1 have a same nominal value based on the same lengths.

Resistors RABL1-RABL4 have values that vary based on the dimensions of the one or more conductive segments corresponding to the respective bit lines ABL1-ABL4, the dimensions including bit line lengths that vary based on a position of a given anti-fuse bit along a given bit line. In the embodiment depicted in FIGS. 1F and 1G, a resistivity of the one or more conductive segments is sufficiently small that such variations are not significant, and each resistor RABL1-RABL4 is considered to have a same nominal value.

Figure 1G:
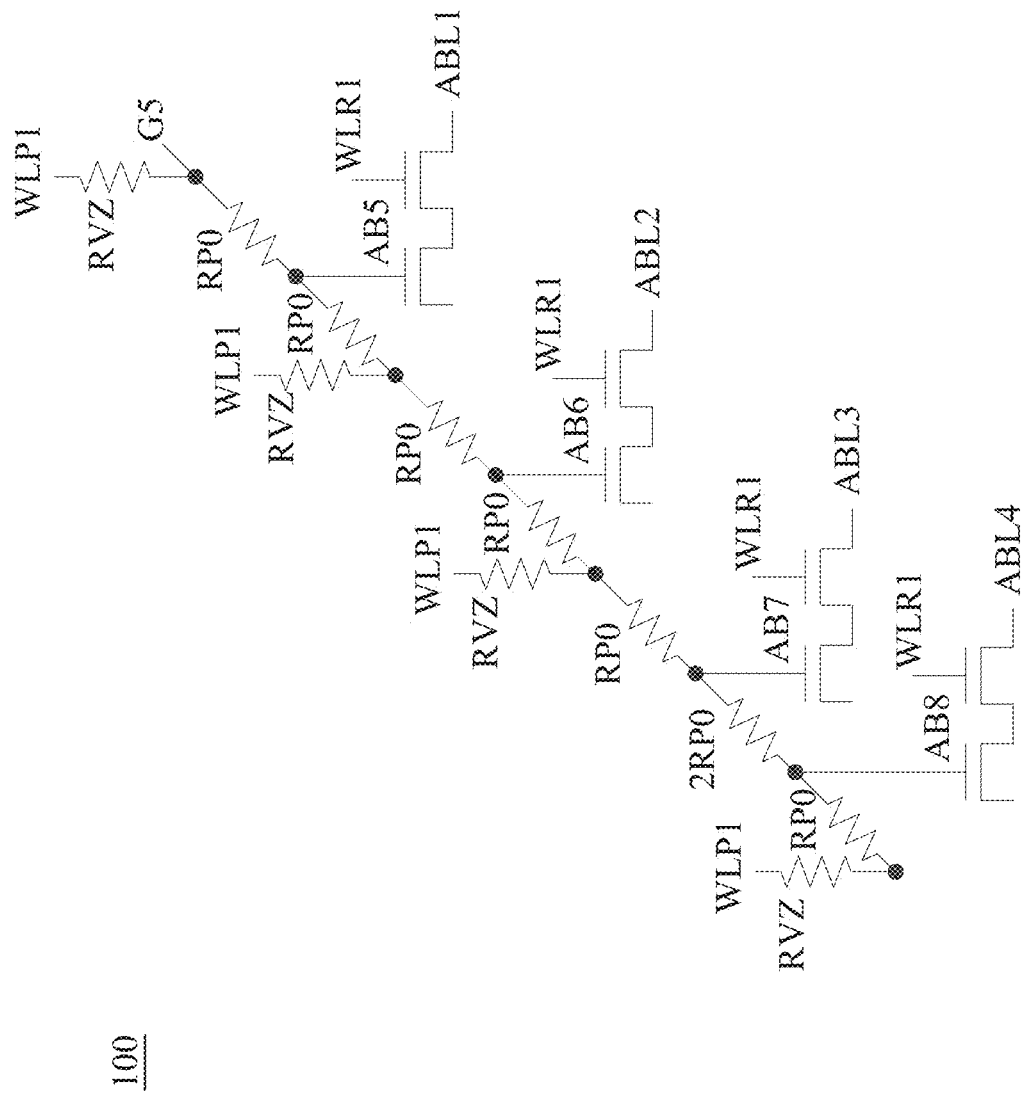

FIG. 1G is a schematic diagram of a portion of anti-fuse layout 100 corresponding to anti-fuse bits AB5-AB8, in accordance with some embodiments. In addition to a subset of the features depicted in FIG. 1F, FIG. 1G includes resistors RVZ and 2RP0.

Each resistor RVZ represents a conductive path corresponding to one of via regions AVR5-AVR7, a corresponding instance of via regions VR3 or VR4 discussed above with respect to FIGS. 1A-1C, and a corresponding portion of the conductive segment based on conductive region AZ5-AZ7 between the one of via regions AVR5-AVR7 and the instance of via region VR3 or VR4. Based on each of conductive regions AZ5-AZ7 having similar layouts, resistors RVZ have a same nominal value.

Each resistor 2RP0 represents the portion of gate structure G5 between adjacent anti-fuse bits AB7 and AB8 free from an electrical connection corresponding to an instance of via region VR3 or VR4. Because gate structure G5 includes two portions corresponding to a resistor RP0 for the portion corresponding to resistor 2RP0, resistor 2RP0 has a nominal value significantly larger than that of resistors RP0. In some embodiments, resistor 2RP0 has a nominal value approximately double that of a resistor RP0.

As discussed above with respect to FIG. 1E, in a read operation on anti-fuse bit B5, signal WLP1 causes current IBL to flow through anti-fuse bit AB5 and bit line ABL1, and the value of current IBL is used to determine the programmed status of anti-fuse bit AB5. As depicted in FIGS. 1F and 1G, the read current path for anti-fuse bit AB5 includes anti-fuse bit AB5 itself and resistor RABL1.

Based on the configuration of anti-fuse layout 100, as depicted in FIG. 1G, the read current path also includes parallel current paths between anti-fuse bit AB5 and signal WLP1 on the conductive segment corresponding to conductive region MR4. Based on conductive regions AZ5 and AZ6 adjacent to anti-fuse bit AB5, each of two parallel current paths has a path resistance equal to the sum of RP0 and RVZ. Based on conductive region AZ7 separated from anti-fuse bit AB5 by anti-fuse bit AB6, a third parallel current path has a path resistance equal to RVZ plus three times RP0.

Similarly, for each anti-fuse bit AB6-AB8, the read current path includes the corresponding anti-fuse bit, one of resistors RABL2-RABL4 corresponding to a respective bit line ABL2-ABL4, and parallel current paths between the anti-fuse bit AB6-AB8 and signal WLP1 on the conductive segment corresponding to conductive region MR4. For each anti-fuse bit AB6-AB8, the parallel paths include at least one path having a path resistance equal to the sum of RP0 and RVZ based on a corresponding conductive region AZ5-AZ7 adjacent to the anti-fuse bit AB6-AB8.

Compared to approaches in which parallel current paths do not include a conductive region adjacent to each anti-fuse bit, an anti-fuse array based on anti-fuse layout 100 includes decreased average current path resistance, and thereby increased operational current values for given values of a signal, e.g., signal WLP1.

In a non-limiting example based on the embodiment depicted in FIGS. 1D-1G, because the parallel read current paths include at least one path based on a conductive region AZ5-AZ7 adjacent to the anti-fuse bit AB8-AB8, an equivalent read current path resistance reduced by 20% compared to an equivalent read current resistance in an approach in which a given anti-fuse bit does not include at least one path of parallel read current paths adjacent to the given anti-fuse bit.

Figure 2:
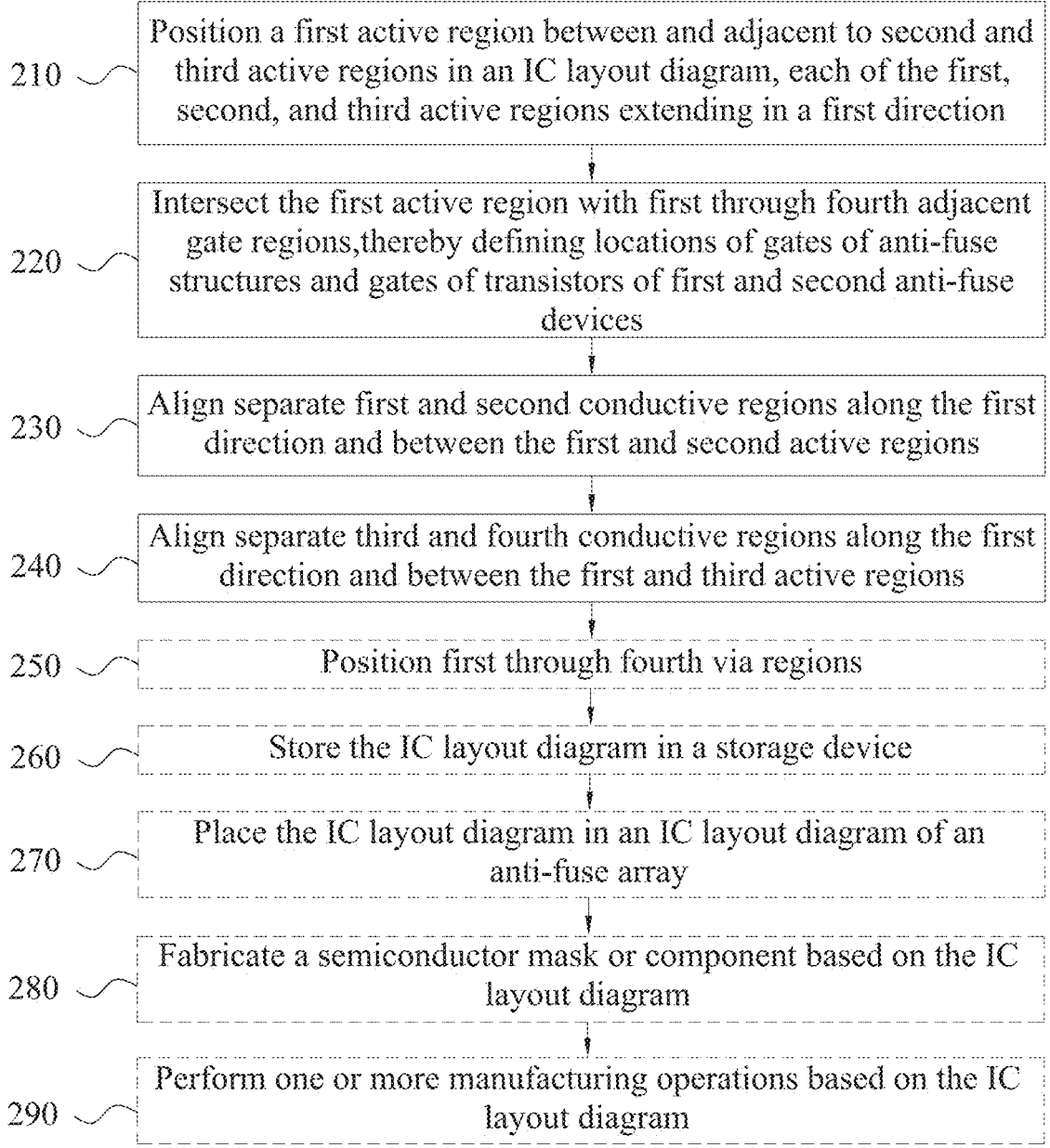
FIG. 2 is a flowchart of a method of generating an IC layout diagram, in accordance with some embodiments.

FIG. 2 is a flowchart of a method 200 of generating an IC layout diagram, in accordance with some embodiments. In some embodiments, generating the IC layout diagram includes generating an IC layout diagram of an anti-fuse layout, e.g., an anti-fuse layout 100A-100C discussed above with respect to FIGS. 1A-1C or anti-fuse layout 100 discussed above with respect to FIGS. 1D-1G.

The operations of method 200 are capable of being performed as part of a method of forming one or more IC devices including one or more anti-fuse structures, e.g., IC device 500 discussed below with respect to FIGS. 5A-5C, manufactured based on the generated IC layout diagram. Non-limiting examples of IC devices include memory circuits, logic devices, processing devices, signal processing circuits, and the like.

In some embodiments, some or all of method 200 is executed by a processor of a computer. In some embodiments, some or all of method 200 is executed by a processor 702 of EDA system 700, discussed below with respect to FIG. 7.

Some or all of the operations of method 200 are capable of being performed as part of a design procedure performed in a design house, e.g., design house 820 discussed below with respect to FIG. 8.

In some embodiments, the operations of method 200 are performed in the order depicted in FIG. 2. In some embodiments, the operations of method 200 are performed in an order other than the order depicted in FIG. 2. In some embodiments, one or more operations are performed before, between, during, and/or after performing one or more operations of method 200.

At operation 210, a first active region is positioned between and adjacent to second and third active regions in an IC layout diagram, each of the first, second, and third active regions extending in a first direction. In some embodiments, positioning the first active region includes obtaining one or more layout cells including some or all of the first, second, and third active regions. In some embodiments, positioning the first active region includes obtaining one or more layout cells from a cell library, e.g., cell library 707 discussed below with respect to FIG. 7.

In some embodiments, positioning the first active region includes defining one or more active regions by abutting one or more layout cells with one or more additional layout cells. In some embodiments, positioning the first active region includes positioning active region AR2 between and adjacent to active regions AR1 and AR3, discussed above with respect to anti-fuse layouts 100A-100C and FIGS. 1A-1C. In some embodiments, positioning each of the first, second, and third active regions extending in the first direction includes positioning active region AR2 between and adjacent to active regions AR1 and AR3 extending in the X direction, discussed above with respect to anti-fuse layouts 100A-100C and FIGS. 1A-1C.

In some embodiments, positioning the first active region includes positioning a plurality of active regions including the first, second, and third active regions. In some embodiments, positioning the plurality of active regions includes positioning the plurality of active regions of an anti-fuse array. In some embodiments, positioning the plurality of active regions of the anti-fuse array includes positioning the plurality of active regions of the anti-fuse array including anti-fuse layout 100, discussed above with respect to FIGS. 1D-1G.

At operation 220, the first active region is intersected with first through fourth adjacent gate regions, thereby defining locations of gates of anti-fuse structures and transistors of first and second anti-fuse devices, also referred to as anti-fuse bits in some embodiments. Intersecting the first active region with the first gate region defines the location of the gate of the anti-fuse structure of the first anti-fuse bit; intersecting the first active region with the second gate region defines the location of the gate of the transistor of the first anti-fuse bit; intersecting the first active region with the third gate region defines the location of the gate of the transistor of the second anti-fuse bit; and intersecting the first active region with the fourth gate region defines the location of the gate of the anti-fuse structure of the second anti-fuse bit.

In various embodiments, intersecting the first active region with the first through fourth adjacent gate regions includes intersecting the first active region with one or more gate regions in addition to the first through fourth adjacent gate regions and/or intersecting the first through fourth adjacent gate regions with one or more active regions in addition to the first active region.

In some embodiments, intersecting the first active region with the first through fourth adjacent gate regions includes intersecting active region AR2 and one or both of active regions AR1 or AR3 with gate regions GR2-GR5, discussed above with respect to anti-fuse layouts 100A-100C and FIGS. 1A-1C.

In some embodiments, intersecting the first active region with the first through fourth adjacent gate regions includes intersecting a plurality of active regions including the first active region with a plurality of gate regions including the first through fourth adjacent gate regions. In some embodiments, intersecting the plurality of active regions with the plurality of gate regions includes intersecting the plurality of active regions with the plurality of gate regions of an anti-fuse array. In some embodiments, intersecting the plurality of active regions with the plurality of gate regions of the anti-fuse array includes intersecting the plurality of active regions with the plurality of gate regions of the anti-fuse array including anti-fuse layout 100, discussed above with respect to FIGS. 1D-1G.

At operation 230, separate first and second conductive regions are aligned along the first direction and between the first and second active regions. Aligning the separate first and second conductive regions includes intersecting the first conductive region with the first gate region and intersecting the second conductive region with the fourth gate region. Aligning the separate first and second conductive regions thereby includes intersecting the first conductive region with a gate region corresponding to the gate of the anti-fuse structure of the first anti-fuse device, and intersecting the second conductive region with a gate region corresponding to the gate of the transistor of the second anti-fuse device.

In various embodiments, aligning the separate first and second conductive regions along the first direction includes aligning conductive region Z1 of layout cell CA1(CA2) and conductive region Z3 of layout cell CB1 along the X direction, discussed above with respect to anti-fuse layout 100A and FIG. 1A, or aligning conductive region Z1 of layout cell CB2 and conductive region Z3 of layout cell CC1(CC2) along the X direction, discussed above with respect to anti-fuse layout 100B and FIG. 1B, or aligning conductive region Z1 or Z2 of layout cell CB2 and corresponding conductive region Z3 or Z4 of layout cell CB1 along the X direction, discussed above with respect to anti-fuse layout 100C and FIG. 1C.

In some embodiments, aligning the separate first and second conductive regions along the first direction includes aligning first conductive regions of a plurality of first conductive regions with corresponding second conductive regions of a plurality of second conductive regions along the first direction. In various embodiments, aligning the separate first and second conductive regions along the first direction includes aligning conductive regions AZ1 and AZ5 along the X direction and/or aligning conductive regions AZ3 and AZ7 along the X direction, discussed above with respect to anti-fuse layout 100 and FIGS. 1D-1G.

In some embodiments, aligning the separate first and second conductive regions includes separating the first and second conductive regions by a space equal to or greater than a predetermined distance based on one or more design rules for the conductive layer that includes the separate first and second conductive regions. In some embodiments, aligning the separate first and second conductive regions includes separating the first and second conductive regions by a space equal to or greater than minimum spacing rule of a metal layer. In some embodiments, aligning the separate first and second conductive regions includes separating the first and second conductive regions by a distance corresponding to a minimum spacing rule of an EUV manufacturing process.

In some embodiments, aligning the separate first and second conductive regions includes positioning a plurality of conductive regions including the first and second conductive regions and one or more conductive regions in addition to the first and second conductive regions. In some embodiments, positioning the plurality of conductive regions includes positioning one or more bit lines. In various embodiments, positioning one or more bit lines includes positioning one or more of bit line BL1 and contact region CR1, discussed above with respect to FIGS. 1A-1C, or bit lines ABL1-ABL4 discussed above with respect to FIGS. 1D-1G.

At operation 240, separate third and fourth conductive regions are aligned along the first direction and between the first and third active regions. Aligning the separate third and fourth conductive regions includes either intersecting the third conductive region with the first gate region and the fourth conductive region with the third gate region, or intersecting the third conductive region with the second gate region and the fourth conductive region with the fourth gate region.

In some embodiments, aligning the separate third and fourth conductive regions along the first direction includes separating the third and fourth conductive regions by a distance corresponding to the minimum spacing rule, e.g., the minimum spacing rule of the EUV manufacturing process. In some embodiments, aligning the separate third and fourth conductive regions along the first direction includes separating the third and fourth conductive regions by a first distance corresponding to a minimum spacing rule, and aligning the separate first and second conductive regions along the first direction includes separating the first and second conductive regions by a second distance greater than the first distance. In some embodiments, separating the third and fourth conductive regions by the first distance includes separating conductive regions Z2 and Z4 by distance D2, and separating the first and second conductive regions by the second distance includes separating conductive regions Z1 and Z3 by distance D1, discussed above with respect to anti-fuse layouts 100A-100C and FIGS. 1A-1C.

In various embodiments, aligning the separate third and fourth conductive regions along the first direction includes aligning conductive region Z2 of layout cell CA1(CA2) and conductive region Z4 of layout cell CB1 along the X direction, discussed above with respect to anti-fuse layout 100A and FIG. 1A, or aligning conductive region Z2 of layout cell CB2 and conductive region Z4 of layout cell CC1(CC2) along the X direction, discussed above with respect to anti-fuse layout 100B and FIG. 1B.

In some embodiments, aligning the separate third and fourth conductive regions along the first direction includes aligning third conductive regions of a plurality of third conductive regions with corresponding fourth conductive regions of a plurality of fourth conductive regions along the first direction. In various embodiments, aligning the separate third and fourth conductive regions along the first direction includes aligning conductive regions AZ2 and AZ6 along the X direction and/or aligning conductive regions AZ4 and AZ8 along the X direction, discussed above with respect to anti-fuse layout 100 and FIGS. 1D-1G.

In some embodiments, when aligning the separate third and fourth conductive regions includes intersecting the third conductive region with the first gate region and the fourth conductive region with the third gate region, aligning the separate first and second conductive regions includes intersecting the first conductive region with the second gate region and the second conductive region with the fourth gate region, e.g., aligning conductive region Z2 of layout cell CA1(CA2) and conductive region Z4 of layout cell CB1 along the X direction, discussed above with respect to anti-fuse layout 100A and FIG. 1A.

In some embodiments, when aligning the separate third and fourth conductive regions includes intersecting the third conductive region with the second gate region and the fourth conductive region with the fourth gate region, aligning the separate first and second conductive regions includes intersecting the first conductive region with the first gate region and the second conductive region with the third gate region, e.g., aligning conductive region Z2 of layout cell CB2 and conductive region Z4 of layout cell CC1(CC2) along the X direction, discussed above with respect to anti-fuse layout 100B and FIG. 1B.

In some embodiments, each of aligning the separate first and second conductive regions along the first direction and aligning the separate third and fourth conductive regions along the first direction comprises separating the corresponding first and second or third and fourth conductive regions by a distance corresponding to a minimum spacing rule. In some embodiments, each of aligning the separate first and second conductive regions along the first direction and aligning the separate third and fourth conductive regions along the first direction comprises separating the corresponding first and second or third and fourth conductive regions by distance D2, discussed above with respect to anti-fuse layouts 100A-100C and FIGS. 1A-1C.

In various embodiments, aligning the separate third and fourth conductive regions along the first direction includes aligning conductive regions AZ1 and AZ5 along the X direction and/or aligning conductive regions AZ3 and AZ7 along the X direction, discussed above with respect to anti-fuse layout 100 and FIGS. 1D-1G.

In some embodiments, aligning the separate third and fourth conductive regions along the first direction includes aligning separate fifth and sixth conductive regions along the first direction. In some embodiments, the third active region is between the third and fourth conductive regions and the fifth and sixth conductive regions, and aligning the separate fifth and sixth conductive regions includes intersecting the fifth conductive region with the first gate region and the sixth conductive region with the fourth gate region, e.g., intersecting one of conductive regions AZ1 or AZ3 with gate region GR2 and one of conductive regions AZ5 or AZ7 with gate region GR5, discussed above with respect to anti-fuse layout 100 and FIGS. 1D-1G.

In some embodiments, the first active region is between the first and second conductive regions and the fifth and sixth conductive regions, when the aligning the separate third and fourth conductive regions includes intersecting the third conductive region with the first gate region and the fourth conductive region with the third gate region, aligning the separate fifth and sixth conductive regions includes intersecting the fifth conductive region with the second gate region and the sixth conductive region with the fourth gate region, and when aligning the separate third and fourth conductive regions includes intersecting the third conductive region with the second gate region and the fourth conductive region with the fourth gate region, aligning the separate fifth and sixth conductive regions includes intersecting the fifth conductive region with the first gate region and the sixth conductive region with the third gate region. In some embodiments, each of aligning the separate third and fourth conductive regions and the separate fifth and sixth conductive regions along the first direction includes separating the corresponding third and fourth or fifth and sixth conductive regions by a distance corresponding to a minimum spacing rule.

At operation 250, in some embodiments, first through fourth via regions are positioned. The first via region is positioned at the intersection of the first conductive region and the first gate region, the second via region is positioned at the intersection of the second conductive region and the fourth gate region, the third via region is positioned at the intersection of the third conductive region and the one of the first or second gate regions, and the fourth via region is positioned at the intersection of the fourth conductive region and the one of the third or fourth gate regions.

In various embodiments, positioning the first through fourth via regions includes positioning respective via regions VR1, VR3, VR2, and VR4 of one of anti-fuse layouts 100A-100C, discussed above with respect to FIGS. 1A-1C.

In some embodiments, positioning the first through fourth via regions includes positioning a plurality of via regions including the first through fourth via regions. In various embodiments, positioning the plurality of via regions includes positioning via regions AVR1-AVR8, discussed above with respect to anti-fuse layout 100 and FIGS. 1D-1G.

In some embodiments, each of positioning the first via region through positioning the fourth via region includes positioning a slot or square via region.

At operation 260, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 270, in some embodiments, the IC layout diagram is placed in an IC layout diagram of an anti-fuse array. In some embodiments, placing the IC layout diagram in the IC layout diagram of the anti-fuse array includes rotating the IC layout diagram about one or more axes or shifting the IC layout diagram relative to one or more additional IC layout diagrams in one or more directions.

In various embodiments, placing the IC layout diagram in the IC layout diagram of an anti-fuse array includes positioning one or more active regions in addition to the first and second active regions, positioning one or more gate regions in addition to the first through fourth gate regions, positioning one or more conductive regions in addition to the first and second conductive regions, and/or positioning one or more via regions in addition to the first and second via regions.

In some embodiments, placing the IC layout diagram in the IC layout diagram of an anti-fuse array includes placing the IC layout diagram in one of anti-fuse arrays 300A-300D discussed below with respect to FIGS. 3A-3D.

In some embodiments, placing the IC layout diagram in the IC layout diagram of an anti-fuse array includes executing one or more operations of method 400 discussed below with respect to FIG. 4.

At operation 280, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 290, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 200, an IC layout diagram is generated in which gate regions corresponding to read current paths have the properties, and thereby the benefits, discussed above with respect to anti-fuse layouts 100A-100C and 100.

FIGS. 3A-3D are diagrams of respective anti-fuse arrays 300A-300D, in accordance with some embodiments. Each of FIGS. 3A-3D depicts a plan view of an IC layout diagram of an arrangement of layout cells CA1, CA2, CB1, CB2, CC1, and CC2, simplified for the purpose of clarity, and the X and Y directions, each discussed above with respect to FIGS. 1A-1D.

Layout cells CA1 and CA2 are represented collectively as layout cells CA such that a location labeled CA corresponds to either one of layout cells CA1 or CA2, and layout cells CC1 and CC2 are represented collectively as layout cells CC such that a location labeled CC corresponds to either one of layout cells CC1 or CC2.

In anti-fuse arrays 300A and 300B, pairs of rows are repeated in four columns extending in the Y direction, and, in anti-fuse arrays 300C and 300D, groups of three rows are repeated in columns extending in the Y direction. The total number of layout cells depicted in each of FIGS. 3A-3D is for illustration only. In various embodiments, one or more of anti-fuse arrays 300A-300D includes layout cells (not shown) in addition to the layout cells depicted in FIGS. 3A-3D.

In anti-fuse array 300A depicted in FIG. 3A, each pair of rows includes a first row (not labeled) in which each layout cell CA abuts a layout cell CB1 in the X direction, corresponding to anti-fuse layout 100A discussed above with respect to FIG. 1A, and a second row (not labeled) in which each layout cell CB2 abuts a layout cell CC in the X direction, corresponding to anti-fuse layout 100B discussed above with respect to FIG. 1B. Within each pair of rows, each pair of layout cells CA and CB1 abuts a pair of layout cells CB2 and CC in the Y direction, corresponding to anti-fuse layout 100 discussed above with respect to FIGS. 1D-1G.

In anti-fuse array 300B depicted in FIG. 3B, each pair of rows includes a first row (not labeled) in which a first layout cell CA abuts a layout cell CB1 in the X direction, corresponding to anti-fuse layout 100A, and a layout cell CB2 abuts a second layout cell CA in the X direction. Each pair of rows also includes a second row (not labeled) in which a layout cell CB2 abuts a first layout cell CC in the X direction, and a second layout cell CC abuts a layout cell CB1 in the X direction. Within each pair of rows, each pair of layout cells CA and CB1 abuts a pair of layout cells CB2 and CC in the Y direction, and each pair of layout cells CB2 and CA abuts a pair of layout cells CC and CB1 in the Y direction.

In anti-fuse array 300C depicted in FIG. 3C, pairs of rows configured in the manner described above with respect to anti-fuse array 300A are separated by additional rows (not labeled) including layout cells CB2 alternating with layout cells CB1. In each additional row, each layout cell CB2 abuts a layout cell CB1, corresponding to anti-fuse layout 100C discussed above with respect to FIG. 1C. Each pair of layout cells CB2 and CB1 abuts a pair of layout cells CA and CB1 in the Y direction and a pair of layout cells CB2 and CC in the Y direction.

In anti-fuse array 300D depicted in FIG. 3D, pairs of rows configured in the manner described above with respect to anti-fuse array 300B are separated by the additional rows (not labeled) configured as described above with respect to anti-fuse array 300C. In each additional row, firsts pairs of layout cells CB2 and CB1 abut pairs of layout cells CA and CB1 in the Y direction and pairs of layout cells CB2 and CC in the Y direction, and second pairs of layout cells CB2 and CB1 abut pairs of layout cells CB2 and CA in the Y direction and pairs of layout cells CC and CB1 in the Y direction.

By the configurations discussed above, each group of four layout cells highlighted in bold in each of anti-fuse arrays 300A and 300B corresponds to two columns of anti-fuse bits in which the highlighted cells define a total of three electrical connections to anti-fuse structures of the first column, one electrical connection to transistors of the first column, three electrical connections to anti-fuse structures of the second column, and one electrical connection to transistors of the second column.

By the configurations discussed above, each group of six layout cells highlighted in bold in each of anti-fuse arrays 300C and 300D corresponds to two columns of anti-fuse bits in which the highlighted cells define a total of five electrical connections to anti-fuse structures of the first column, one electrical connection to transistors of the first column, five electrical connections to anti-fuse structures of the second column, and one electrical connection to transistors of the second column.

In some embodiments, an anti-fuse array (not shown) includes additional rows of layout cells CB2 and CB1 in addition to those depicted in FIGS. 3C and 3D, between and/or within pairs of rows configured as depicted in FIG. 3A or 3B, and the anti-fuse array thereby includes groups of layout cells that define more than five, e.g., seven, electrical connections to anti-fuse structures for each electrical connection to transistors in a given column of anti-fuse bits.

In some embodiments, an anti-fuse array (not shown) includes one or more combinations of the layout cell configurations depicted in FIGS. 3A-3D and thereby includes groups of layout cells that define at least three electrical connections to anti-fuse structures for each electrical connection to transistors in a given column of anti-fuse bits.

By including the configurations discussed above, IC layout diagrams of anti-fuse arrays 300A-300D, and IC devices manufactured based thereon, are capable of realizing the benefits discussed above with respect to anti-fuse layouts 100A-100C and 100.

Figure 4:
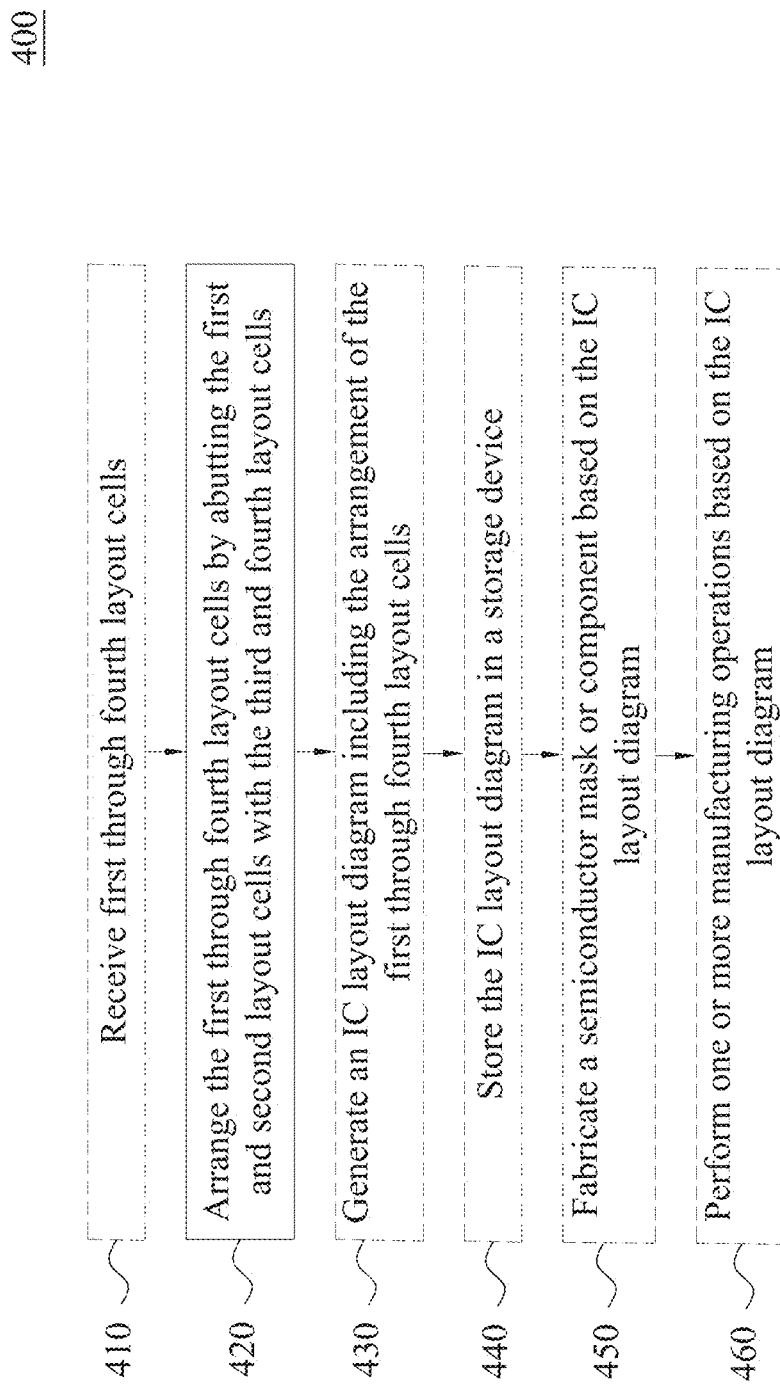
FIG. 4 is a flowchart of a method of generating an IC layout diagram, in accordance with some embodiments.

FIG. 4 is a flowchart of a method 400 of generating an IC layout diagram, in accordance with some embodiments. In some embodiments, generating the IC layout diagram includes generating an IC layout diagram of an anti-fuse array, e.g., anti-fuse layout 100, discussed above with respect to FIGS. 1D-1G, or an anti-fuse array 300A-300D, discussed above with respect to FIGS. 3A-3D.

The operations of method 400 are capable of being performed as part of a method of forming one or more IC devices including one or more anti-fuse structures, e.g., IC device 500 discussed below with respect to FIGS. 5A-5C, manufactured based on the generated IC layout diagram. Non-limiting examples of IC devices include memory circuits, logic devices, processing devices, signal processing circuits, and the like.

In some embodiments, some or all of method 400 is executed by a processor of a computer. In some embodiments, some or all of method 400 is executed by a processor 702 of EDA system 700, discussed below with respect to FIG. 7.

Some or all of the operations of method 400 are capable of being performed as part of a design procedure performed in a design house, e.g., design house 820 discussed below with respect to FIG. 8.

In some embodiments, the operations of method 400 are performed in the order depicted in FIG. 4. In some embodiments, the operations of method 400 are performed in an order other than the order depicted in FIG. 4. In some embodiments, one or more operations are performed before, between, during, and/or after performing one or more operations of method 400.

At operation 410, in some embodiments, first through fourth layout cells are received. Receiving the first through fourth layout cells includes receiving one of layout cells CA1 or CA2, one of layout cells CC1 or CC2, layout cell CB1, and layout cell CB2, discussed above with respect to anti-fuse layouts 100A-100C and FIGS. 1A-1C.

In some embodiments, receiving the first through fourth layout cells includes executing one or more operations of method 200 discussed above with respect to FIG. 2.

In some embodiments, receiving the first through fourth layout cells includes obtaining one or more layout cells from a cell library, e.g., cell library 707 discussed below with respect to FIG. 7.

At operation 420, the first through fourth layout cells are arranged by abutting the first and second layout cells with the third and fourth layout cells. The first layout cell abutted with the second layout cell collectively defines a first active region corresponding to first and second anti-fuse bits; the third layout cell abutted with the fourth layout cell collectively defines a second active region corresponding to third and fourth anti-fuse bits; the first through fourth layout cells collectively define a third active region corresponding to fifth and sixth anti-fuse bits adjacent to the first and second anti-fuse bits and to the third and fourth anti-fuse bits; the first layout cell includes a first via region overlapping a first gate region shared by anti-fuse structures of the first, third, and fifth anti-fuse bits, and a second via region overlapping a second gate region shared by transistor structures of the first, third, and fifth anti-fuse bits; the fourth layout cell includes a third via region overlapping a third gate region shared by transistor structures of the second, fourth, and sixth anti-fuse bits, and a fourth via region overlapping a fourth gate region shared by anti-fuse structures of the second, fourth, and sixth anti-fuse bits; the third layout cell includes fifth and sixth via regions overlapping the first gate region; and the second layout cell includes seventh and eighth via regions overlapping the fourth gate region.

In some embodiments, the second via is positioned between the first and third active regions, or the third via is positioned between the second and third active regions.

In some embodiments, arranging the first through fourth layout cells includes abutting each layout cell arrangement of the plurality of identical layout cell arrangements with at least two additional layout cell arrangements of the plurality of identical layout cell arrangements, thereby forming an anti-fuse array.

In some embodiments, arranging the first through fourth layout cells includes abutting fifth and sixth layout cells with the first and second layout cells, the fifth layout cell including ninth and tenth via regions overlapping the first gate region, and the sixth layout cell including eleventh and twelfth via regions overlapping the fourth gate region. In some embodiments, arranging the first through fourth layout cells further includes abutting each layout cell arrangement of the plurality of identical layout cell arrangements with at least two additional layout cell arrangements of the plurality of identical layout cell arrangements, thereby forming an anti-fuse array.

In various embodiments, arranging the first through fourth layout cells includes arranging layout cells CA, CB1, CB2, and CC in accordance with one of anti-fuse arrays 300A-300D, discussed above with respect to FIGS. 3A-3D.

At operation 430, in some embodiments, an IC layout diagram including the arrangement of the first through fourth layout cells is generated. In some embodiments, generating the IC layout diagram includes generating the IC layout diagram including one or more of anti-fuse layouts 100A-100C, discussed above with respect to FIGS. 1A-1C, anti-fuse layout 100 discussed above with respect to FIGS. 1D-1G, or anti-fuse array 300A-300D, discussed above with respect to FIGS. 3A-3D.

At operation 440, in some embodiments, the IC layout diagram is stored in a storage device. In various embodiments, storing the IC layout diagram in the storage device includes storing the IC layout diagram in a non-volatile, computer-readable memory or a cell library, e.g., a database, and/or includes storing the IC layout diagram over a network. In some embodiments, storing the IC layout diagram in the storage device includes storing the IC layout diagram over network 714 of EDA system 700, discussed below with respect to FIG. 7.

At operation 450, in some embodiments, at least one of one or more semiconductor masks, or at least one component in a layer of a semiconductor IC is fabricated based on the IC layout diagram. Fabricating one or more semiconductor masks or at least one component in a layer of a semiconductor IC is discussed below with respect to FIG. 8.

At operation 460, in some embodiments, one or more manufacturing operations are performed based on the IC layout diagram. In some embodiments, performing one or more manufacturing operations includes performing one or more lithographic exposures based on the IC layout diagram. Performing one or more manufacturing operations, e.g., one or more lithographic exposures, based on the IC layout diagram is discussed below with respect to FIG. 8.

By executing some or all of the operations of method 400, an IC layout diagram is generated in which gate regions corresponding to read current paths have the properties, and thereby the benefits, discussed above with respect to anti-fuse layouts 100A-100C and 100.

Figure 5A:
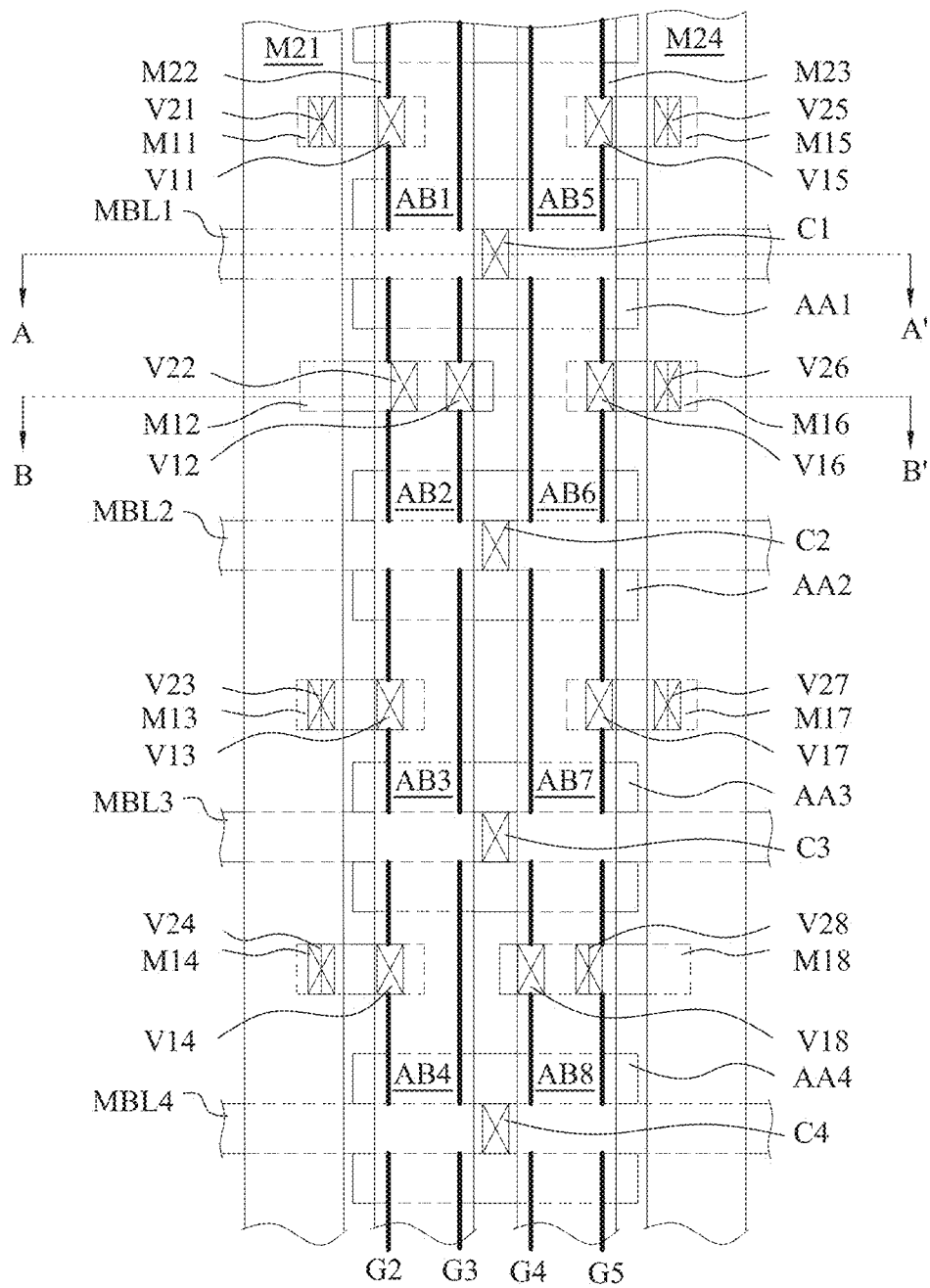
FIGS. 5A-5C are diagrams of an IC device, in accordance with some embodiments.
Figure 5B:
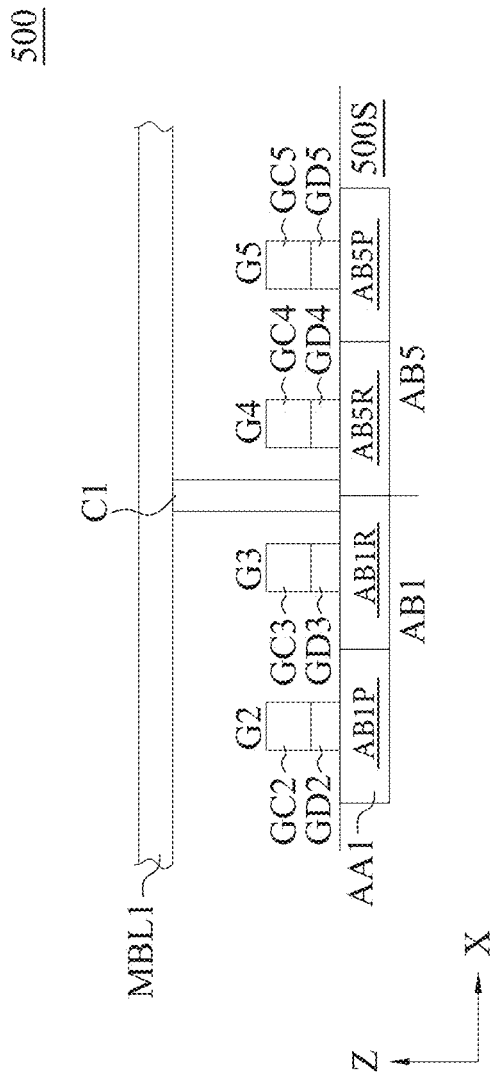
Figure 5C:
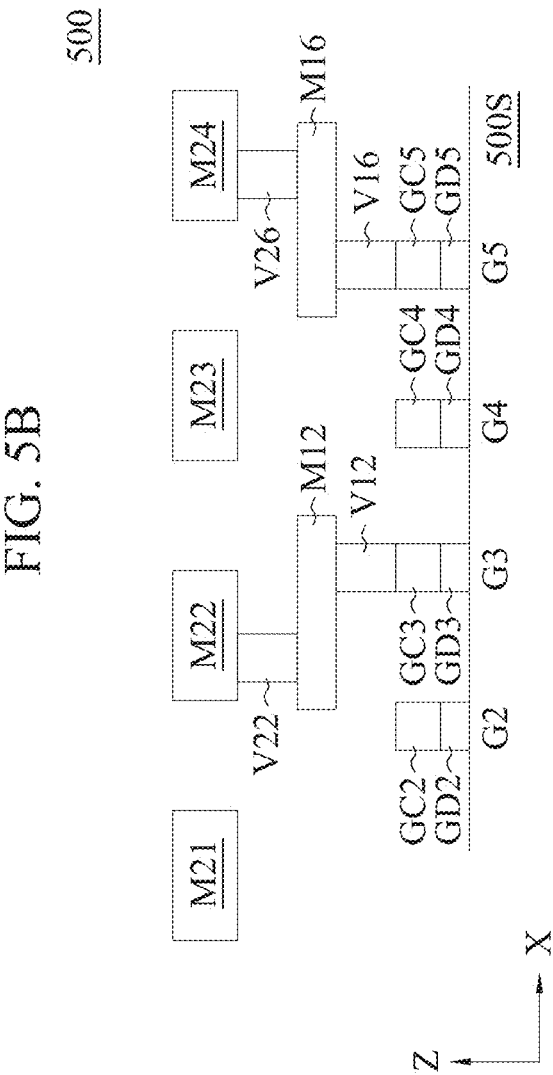

FIGS. 5A-5C are diagrams of IC device 500, in accordance with some embodiments. IC device 500 is formed by executing some or all of the operations of methods 200 and/or 400 and is configured based on anti-fuse layouts 100A-100C and 100, discussed above with respect to FIGS. 1A-1G. In some embodiments, IC device 500 is included in an IC device 860 manufactured by an IC manufacturer/fabricator ("fab") 850, discussed below with respect to FIG. 8.

FIG. 5A depicts a plan view of IC device 500, simplified for the purpose of clarity, the X and Y directions discussed above with respect to FIGS. 1A-1D, and anti-fuse bits AB1-AB8 discussed above with respect to FIGS. 1D-1G. FIG. 5B depicts a cross-sectional view along a plane A-A', the X direction, and a Z direction perpendicular to each of the X and Y directions, and FIG. 5C depicts a cross-sectional view along a plane B-B' and the X and Z directions.

IC device 500 includes active areas AA1-AA4, gate structures G2-G5, contacts C1-C4, conductive segments MBL1-MBL4, M11-M18, and M21-M24, and vias V11-V18 and V21-V28, configured as discussed below.

Each of active areas AA1-AA4 is an N-type or P-type active area of substrate 500S extending in the X direction and configured in accordance with an active region, e.g., an active region AR1-AR3 discussed above with respect to FIGS. 1A-1C.

Gate structures G2-G5 are gate structures extending in the Y direction and configured in accordance with respective gate regions GR2-GR5 discussed above with respect to FIGS. 1A-1D, and thereby include gate conductors GC2-GC5 overlying dielectric layers GD2-GD5, respectively.

Contacts C1-C4 are conductive structures electrically connected to respective active areas AA1-AA4 and configured in accordance with a contact region, e.g., contact region CR1 discussed above with respect to FIGS. 1A-1C.

Conductive segments MBL1-MBL4, also referred to as bit lines MBL1-MBL4 in some embodiments, are conductive segments extending in the X direction, electrically connected to respective contacts C1-C4, and configured in accordance with a conductive region, e.g., bit line BL1 discussed above with respect to FIGS. 1A-1C. In the embodiment depicted in FIG. 5A, conductive segments MBL1-MBL4 are conductive segments of a first metal layer. In some embodiments, one or more of conductive segments MBL1-MBL4 is a conductive segment of a layer other than a first metal layer, e.g., a second or third metal layer.

Conductive segments M11-M18 are conductive segments extending in the X direction and configured in accordance with a conductive region, e.g., a conductive region Z1-Z4 discussed above with respect to FIGS. 1A-1C or a conductive region AZ1-AZ8 discussed above with respect to FIG. 1D. In the embodiment depicted in FIG. 5A, conductive segments M11-M18 are conductive segments of a first metal layer. In some embodiments, one or more of conductive segments M11-M18 is a conductive segment of a layer other than a first metal layer, e.g., a second or third metal layer.

Conductive segments M21-M24 are conductive segments, referred to as conductive lines in some embodiments, extending in the Y direction and configured in accordance with a conductive region, e.g., a conductive region MR1-MR4 discussed above with respect to FIG. 1D. In the embodiment depicted in FIG. 5A, conductive segments M21-M24 are conductive segments of a second metal layer. In some embodiments, one or more of conductive segments M21-M24 is a conductive segment of a layer other than a second metal layer, e.g., a third or fourth metal layer.

Each of vias V11-V18 is a conductive structure electrically connected to one of gate conductors GC2-GC5 and to the respective overlying one of conductive segments M11-

M18, and is configured in accordance with a via region, e.g., a via region VR1-VR4 discussed above with respect to FIGS. 1A-1G.

Each of vias V21-V28 is a conductive structure electrically connected to the respective underlying one of conductive segments M11-M18 and to an overlying one of conductive segments M21-M24, and is configured in accordance with a via region, e.g., a respective one of via regions AVR1-AVR8 discussed above with respect to FIGS. 1D-1G.

The depictions of IC device 500 in FIGS. 5A-5C are simplified for the purpose of illustration. In various embodiments, IC device 500 includes one or more elements, e.g., source/drain regions within each of active areas AA1-AA4, in addition to those discussed above.

Unless specifically indicated, the elements discussed above have shapes, sizes, and spatial relationships depicted in FIGS. 5A-5C solely for the purpose of illustration. In various embodiments, IC device 500 includes the elements having shapes, sizes, and/or spatial relationships other than those depicted in FIGS. 5A-5C.

As depicted in FIG. 5B, gate structure G2 overlying active area AA1 is included in an anti-fuse structure AB1P of anti-fuse bit AB1, gate structure G3 overlying active area AA1 is included in a transistor AB1R of anti-fuse bit AB1, gate structure G4 overlying active area AA1 is included in a transistor AB5R of anti-fuse bit AB5, and gate structure G5 overlying active area AA1 is included in an anti-fuse structure AB5P of anti-fuse bit AB5.

Similarly, gate structures G2 and G3 overlying active area AA2 are included in an anti-fuse structure and a transistor, respectively, of anti-fuse bit AB2; gate structures G2 and G3 overlying active area AA3 are included in an anti-fuse structure and a transistor, respectively, of anti-fuse bit AB3; gate structures G2 and G3 overlying active area AA4 are included in an anti-fuse structure and a transistor, respectively, of anti-fuse bit AB4; gate structures G4 and G5 overlying active area AA2 are included in a transistor and an anti-fuse structure, respectively, of anti-fuse bit AB6; gate structures G4 and G5 overlying active area AA3 are included in a transistor and an anti-fuse structure, respectively, of anti-fuse bit AB7; and gate structures G4 and G5 overlying active area AA4 are included in a transistor and an anti-fuse structure, respectively, of anti-fuse bit AB8. Anti-fuse structures and transistors corresponding to anti-fuse bits AB2-AB4 and AB6-AB8 are not labeled or depicted in detail for the purpose of clarity.

As depicted in FIG. 5B, contact C1 is electrically connected to conductive segment MBL1 and electrically connected to active area AA1 between gate structures G3 and G4, and is thereby configured as part of a current path from conductive segment MBL1 to each of transistor AB1R of anti-fuse bit AB1 and transistor AB5R of anti-fuse bit AB5. The portion of IC device 500 depicted in FIG. 5B thereby corresponds to the schematic diagram of anti-fuse layout 100 depicted in FIG. 1E and discussed above.

As depicted in FIG. 5C, via V12 is electrically connected to underlying gate conductor GC3 and to overlying conductive segment M12, and via V22 is electrically connected to underlying conductive segment M12 and to overlying conductive segment M22. Via V16 is electrically connected to underlying gate conductor GC5 and to overlying conductive segment M16, and via V26 is electrically connected to underlying conductive segment M16 and to overlying conductive segment M24. Conductive segments M12 and M16 aligned in the X direction thereby correspond to respective conductive regions AZ2 and AZ4 of anti-fuse layout 100 depicted in FIG. 1D and discussed above.

Similarly, conductive segment M11, electrically connected to gate conductor GC2 through via V11 and to conductive segment M21 through via V21, aligned in the X direction with conductive segment M15, electrically connected to gate conductor GC5 through via V15 and to conductive segment M24 through via V25, collectively correspond to respective conductive regions AZ1 and AZ5 of anti-fuse layout 100; conductive segment M13, electrically connected to gate conductor GC2 through via V13 and to conductive segment M21 through via V23, aligned in the X direction with conductive segment M17, electrically connected to gate conductor GC5 through via V17 and to conductive segment M24 through via V27, collectively correspond to respective conductive regions AZ3 and AZ7 of anti-fuse layout 100; and conductive segment M14, electrically connected to gate conductor GC2 through via V14 and to conductive segment M21 through via V24, aligned in the X direction with conductive segment M18, electrically connected to gate conductor GC4 through via V18 and to conductive segment M23 through via V28, collectively correspond to respective conductive regions AZ4 and AZ8 of anti-fuse layout 100.

By the configuration discussed above and depicted in FIGS. 5A-5C, IC device 500 corresponds to anti-fuse layout 100 discussed above with respect to FIGS. 1D-1G and including layout cells CA, CB1, CB2, and CC arranged in accordance with anti-fuse array 300A discussed above with respect to FIG. 3A. IC device 500 thereby includes a first anti-fuse structure including a dielectric layer between a first gate conductor and a first active area, e.g., the anti-fuse structure of anti-fuse bit AB3 including dielectric layer GD2 between gate conductor GC2 and active area AA3; a second anti-fuse structure including a dielectric layer between a second gate conductor and the first active area, e.g., the anti-fuse structure of anti-fuse bit AB7 including dielectric layer GD5 between gate conductor GC5 and active area AA3; a first transistor including a third gate conductor, e.g., the transistor of anti-fuse bit AB3 including gate conductor GC3, between the first and second gate conductors; a second transistor including a fourth gate conductor, e.g., the transistor of anti-fuse bit AB7 including gate conductor GC4, between the second and third gate conductors; first and second vias, e.g., vias V13 and V14, electrically connected to the first gate conductor; a third via, e.g., via V17, electrically connected to the second gate conductor; and a fourth via, e.g., via V18 electrically connected to the fourth gate conductor. The first and third vias are aligned with each other along the X direction, the second and fourth vias are aligned with each other along the X direction, and each of the first, second, third, and fourth vias is closer to the first active area than second and third active areas, e.g., active areas AA2 and AA4, adjacent to the first active area along the Y direction.

In various embodiments, IC device 500 corresponds to layout cells CA, CB1, CB2, and CC otherwise arranged, e.g., in accordance with one or more of anti-fuse arrays 300B-300D discussed above with respect to FIGS. 3B-3D, and thereby includes first through fourth vias having the configuration discussed above in which each of the first through fourth vias is closer to a first active area than second and third active areas adjacent to the first active area along the Y direction.

By being configured in accordance with anti-fuse layouts 100A-100C and 100, and/or anti-fuse arrays 300A-300D, discussed above with respect to FIGS. 1A-1D and 3A-3D, and manufactured through execution of some or all of the operations of methods 200 and 400, discussed above with respect to FIGS. 2 and 4, IC device 500 enables the realization of the advantages discussed above with respect to anti-fuse layouts 100A-100C and 100.

FIG. 6 is a flowchart of a method 600 of operating an anti-fuse bit, in accordance with some embodiments. The operations of method 600 are capable of being performed as part of a method of operating one or more IC devices including one or more anti-fuse structures, e.g., IC device 500 discussed above with respect to FIGS. 5A-5C.

In some embodiments, the operations of method 600 are performed in the order depicted in FIG. 6. In some embodiments, the operations of method 600 are performed in an order other than the order depicted in FIG. 6. In some embodiments, one or more operations are performed before, between, during, and/or after performing one or more operations of method 600.

At operation 610, a first voltage is applied to a program line electrically connected to a gate structure included in anti-fuse structures of each of four adjacent anti-fuse bits. In various embodiments, applying the first voltage to the program line includes applying a read voltage as part of a read operation or applying a program voltage as part of a programming operation.

In some embodiments, applying the first voltage to the program line includes applying signal WLP0 or WLP1, discussed above with respect to anti-fuse layout 100 and FIGS. 1D-1G, to respective conductive line M21 or M24, discussed above with respect to IC device 500 and FIGS. 5A-5C.

At operation 620, a second voltage is applied to a bit line electrically connected to a first anti-fuse bit of the four adjacent anti-fuse bits, thereby causing a bit cell current to flow through the anti-fuse structure of the first anti-fuse bit, a current path of the bit cell current including four vias between the program line and the gate structure, each of the four vias being adjacent to an anti-fuse bit of the four adjacent anti-fuse bits.

A magnitude of the bit cell current is based on a voltage level of the first voltage, a voltage level of the second voltage, and a resistance of the current path between the program line and the gate structure. In some embodiments, the current path between the program line and the gate structure includes vias V11, V13, V14, and a fourth via (not shown) adjacent to anti-fuse bits AB1-AB4, or vias V15-V17, and a fourth via (not shown) adjacent to anti-fuse bits AB5-AB5, discussed above with respect to IC device 500 and FIGS. 5A-5C.

In some embodiments, applying the second voltage includes applying a bit line voltage to one of bit lines MBL1-MBL4, discussed above with respect to IC device 500 and FIGS. 5A-5C.

At operation 630, in some embodiments, the bit cell current is sensed using a sense amplifier. In some embodiments, sensing the bit cell current using the sense amplifier includes determining a programmed status of the corresponding anti-fuse structure.

At operation 640, in some embodiments, one or more of operations 610-630 are repeated for at least a second bit cell structure, thereby causing bit cell currents to flow in two or more bit cell structures. In various embodiments, repeating one or more of operations 610-630 includes causing a bit cell current to flow in a second one of the four bit cell structures and/or causing a bit cell current to flow in a bit cell structure other than the four bit cell structures.

By executing some or all of the operations of method 600, an anti-fuse bit operation is performed in which gate structure portions of read current paths have the properties, and thereby the benefits, discussed above with respect to anti-fuse layouts 100A-100C and 100.

Figure 7:
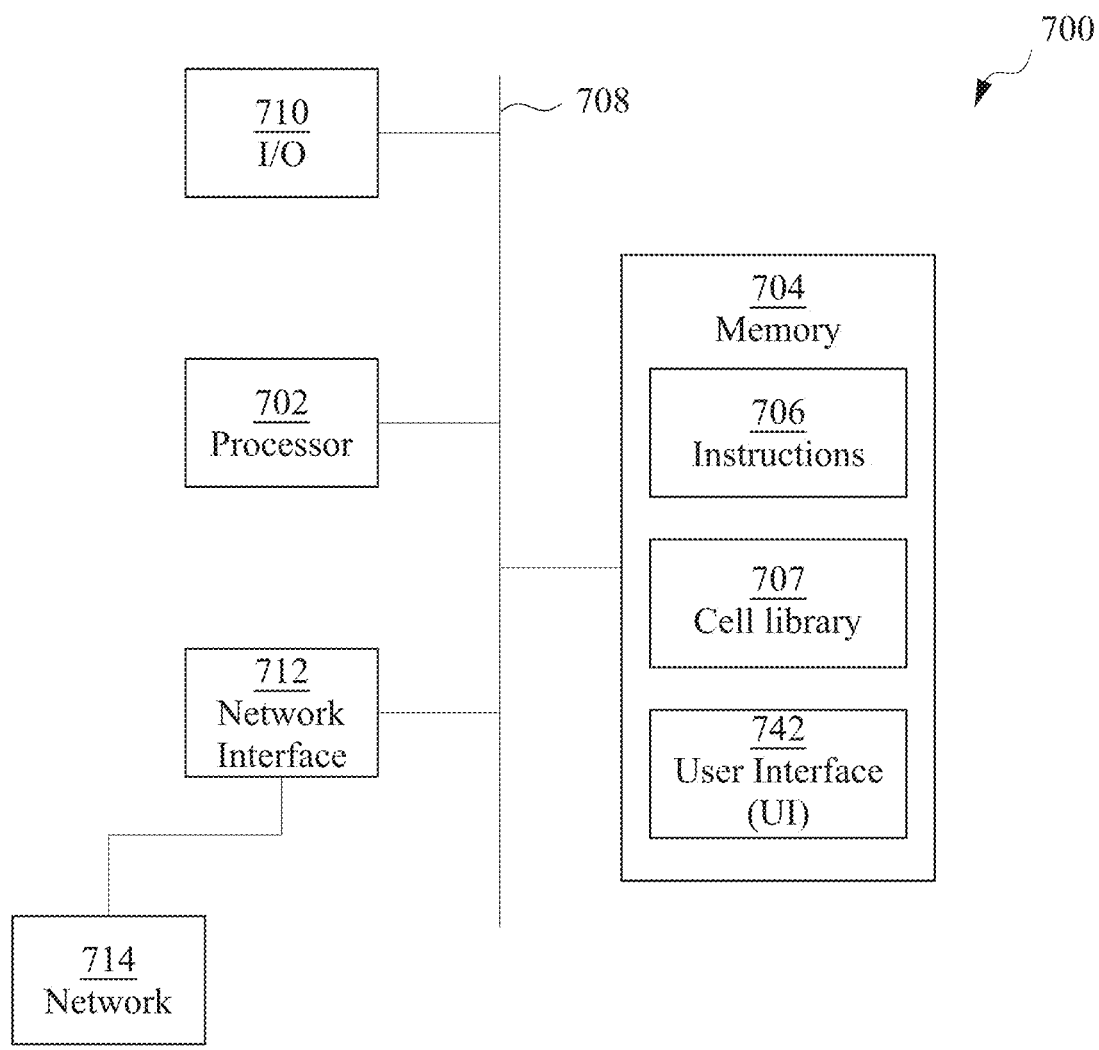
FIG. 7 is a block diagram of an electronic design automation (EDA) system, in accordance with some embodiments.

FIG. 7 is a block diagram of an electronic design automation (EDA) system 700, in accordance with some embodiments.

In some embodiments, EDA system 700 includes an APR system. Methods described herein of designing layout diagrams representing wire routing arrangements, in accordance with one or more embodiments, are implementable, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., method 200 discussed above with respect to FIG. 2 and/or method 400 discussed above with respect to FIG. 4 (hereinafter, the noted processes and/or methods).

Processor 702 is electrically coupled to computer-readable storage medium 704 via a bus 708. Processor 702 is also electrically coupled to an I/O interface 710 by bus 708. A network interface 712 is also electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 also stores information which facilitates performing a portion or all of the noted processes and/or methods. In one or more embodiments, storage medium 704 stores cell library 707 including such cells as disclosed herein, e.g., a layout cell CA1, CA2, CB1, CB2, CC1, or CC2, and/or an anti-fuse layout 100A-100C discussed above with respect to FIGS. 1A-1C.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 also includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout diagram which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
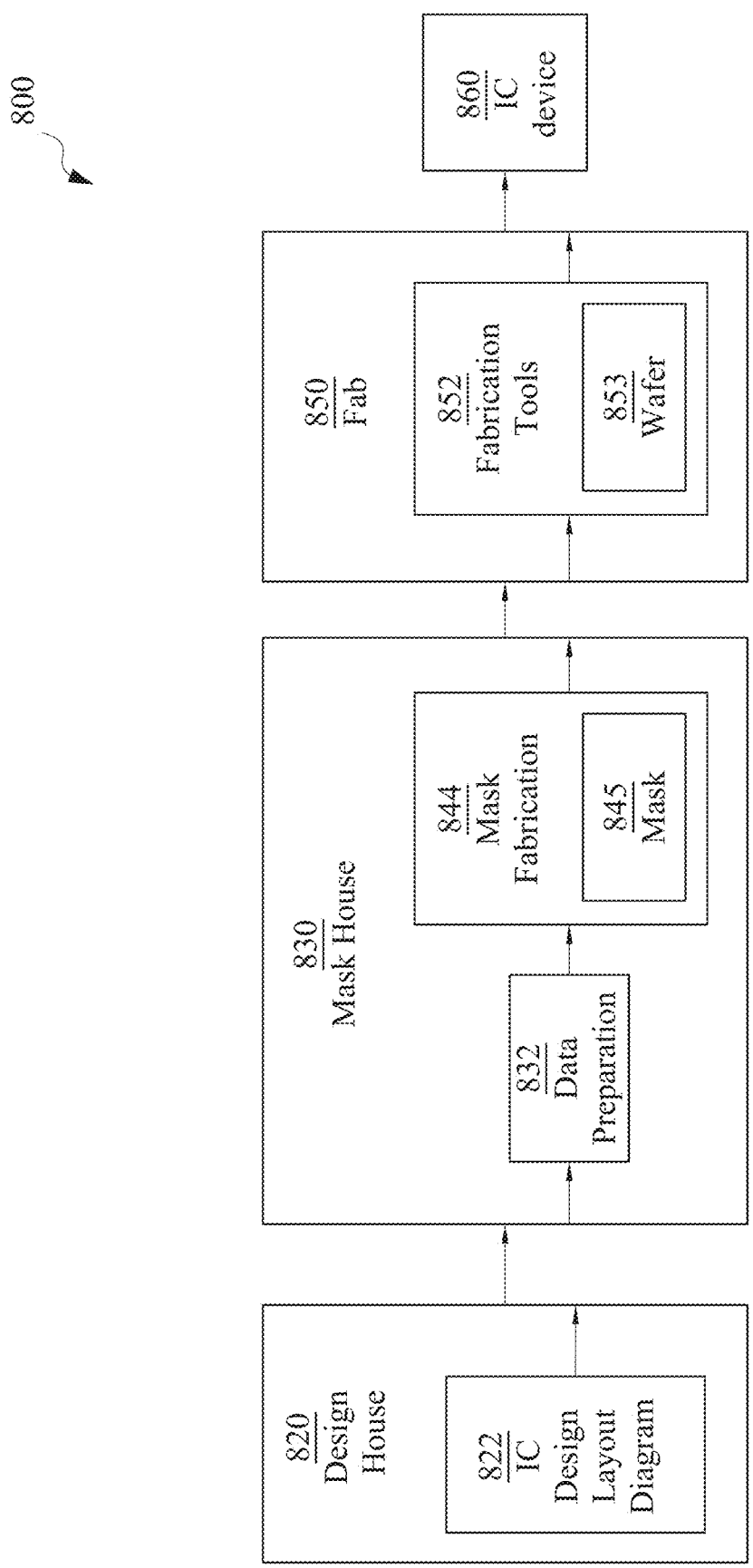
FIG. 8 is a block diagram of an IC manufacturing system, and an IC manufacturing flow associated therewith, in accordance with some embodiments.

FIG. 8 is a block diagram of IC manufacturing system 800, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using manufacturing system 800.

In FIG. 8, IC manufacturing system 800 includes entities, such as a design house 820, a mask house 830, and an IC manufacturer/fabricator ("fab") 850, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet.

The communications network includes wired and/or wireless communication channels. Each entity interacts with one or more of the other entities and provides services to and/or receives services from one or more of the other entities. In some embodiments, two or more of design house 820, mask house 830, and IC fab 850 is owned by a single larger company. In some embodiments, two or more of design house 820, mask house 830, and IC fab 850 coexist in a common facility and use common resources.

Design house (or design team) 820 generates an IC design layout diagram 822. IC design layout diagram 822 includes various geometrical patterns, e.g., an IC layout diagram depicted in FIG. 1A-1D or 3A-3D, designed for an IC device 860, e.g., IC device 500, discussed above with respect to FIGS. 5A-5C. The geometrical patterns correspond to patterns of metal, oxide, or semiconductor layers that make up the various components of IC device 860 to be fabricated. The various layers combine to form various IC features. For example, a portion of IC design layout diagram 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout diagram 822. The design procedure includes one or more of logic design, physical design or place and route. IC design layout diagram 822 is presented in one or more data files having information of the geometrical patterns. For example, IC design layout diagram 822 can be expressed in a GDSII file format or DFII file format.

Mask house 830 includes data preparation 832 and mask fabrication 844. Mask house 830 uses IC design layout diagram 822 to manufacture one or more masks 845 to be used for fabricating the various layers of IC device 860 according to IC design layout diagram 822. Mask house 830 performs mask data preparation 832, where IC design layout diagram 822 is translated into a representative data file ("RDF"). Mask data preparation 832 provides the RDF to mask fabrication 844. Mask fabrication 844 includes a mask writer. A mask writer converts the RDF to an image on a substrate, such as a mask (reticle) 845 or a semiconductor wafer 853. The design layout diagram 822 is manipulated by mask data preparation 832 to comply with particular characteristics of the mask writer and/or requirements of IC fab 850. In FIG. 8, mask data preparation 832 and mask fabrication 844 are illustrated as separate elements. In some embodiments, mask data preparation 832 and mask fabrication 844 can be collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout diagram 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, mask data preparation 832 includes a mask rule checker (MRC) that checks the IC design layout diagram 822 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 822 to compensate for limitations during mask fabrication 844, which may undo part of the modifications performed by OPC in order to meet mask creation rules.

In some embodiments, mask data preparation 832 includes lithography process checking (LPC) that simulates processing that will be implemented by IC fab 850 to fabricate IC device 860. LPC simulates this processing based on IC design layout diagram 822 to create a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout diagram 822.

It should be understood that the above description of mask data preparation 832 has been simplified for the purposes of clarity. In some embodiments, data preparation 832 includes additional features such as a logic operation (LOP) to modify the IC design layout diagram 822 according to manufacturing rules. Additionally, the processes applied to IC design layout diagram 822 during data preparation 832 may be executed in a variety of different orders.

After mask data preparation 832 and during mask fabrication 844, a mask 845 or a group of masks 845 are fabricated based on the modified IC design layout diagram 822. In some embodiments, mask fabrication 844 includes performing one or more lithographic exposures based on IC design layout diagram 822. In some embodiments, an electron-beam (e-beam) or a mechanism of multiple e-beams is used to form a pattern on a mask (photomask or reticle) 845 based on the modified IC design layout diagram 822. Mask 845 can be formed in various technologies. In some embodiments, mask 845 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of mask 845 includes a transparent substrate (e.g., fused quartz) and an opaque material (e.g., chromium) coated in the opaque regions of the binary mask. In another example, mask 845 is formed using a phase shift technology. In a phase shift mask (PSM) version of mask 845, various features in the pattern formed on the phase shift mask are configured to have proper phase difference to enhance the resolution and imaging quality. In various examples, the phase shift mask can be attenuated PSM or alternating PSM. The mask(s) generated by mask fabrication 844 is used in a variety of processes. For example, such a mask(s) is used in an ion implantation process to form various doped regions in semiconductor wafer 853, in an etching process to form various etching regions in semiconductor wafer 853, and/or in other suitable processes.

IC fab 850 is an IC fabrication business that includes one or more manufacturing facilities for the fabrication of a variety of different IC products. In some embodiments, IC Fab 850 is a semiconductor foundry. For example, there may be a manufacturing facility for the front end fabrication of a plurality of IC products (front-end-of-line (FEOL) fabrication), while a second manufacturing facility may provide the back end fabrication for the interconnection and packaging of the IC products (back-end-of-line (BEOL) fabrication), and a third manufacturing facility may provide other services for the foundry business.

IC fab 850 includes wafer fabrication tools 852 configured to execute various manufacturing operations on semiconductor wafer 853 such that IC device 860 is fabricated in accordance with the mask(s), e.g., mask 845. In various embodiments, fabrication tools 852 include one or more of a wafer stepper, an ion implanter, a photoresist coater, a process chamber, e.g., a CVD chamber or LPCVD furnace, a CMP system, a plasma etch system, a wafer cleaning system, or other manufacturing equipment capable of performing one or more suitable manufacturing processes as discussed herein.

IC fab 850 uses mask(s) 845 fabricated by mask house 830 to fabricate IC device 860. Thus, IC fab 850 at least indirectly uses IC design layout diagram 822 to fabricate IC device 860. In some embodiments, semiconductor wafer 853 is fabricated by IC fab 850 using mask(s) 845 to form IC device 860. In some embodiments, the IC fabrication includes performing one or more lithographic exposures based at least indirectly on IC design layout diagram 822. Semiconductor wafer 853 includes a silicon substrate or other proper substrate having material layers formed thereon. Semiconductor wafer 853 further includes one or more of various doped regions, dielectric features, multi-level interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method of generating an IC layout diagram includes arranging first through fourth layout cells by abutting the first and second layout cells, thereby defining a first active region corresponding to first and second anti-fuse bits, and abutting the third and fourth layout cells, thereby defining a second active region corresponding to third and fourth anti-fuse bits, wherein arranging the first through fourth layout cells collectively defines a third active region corresponding to fifth and sixth anti-fuse bits adjacent to the first and second anti-fuse bits and to the third and fourth anti-fuse bits, the first layout cell includes a first via region overlapping a first gate region shared by anti-fuse structures of the first, third, and fifth anti-fuse bits, and a second via region overlapping a second gate region shared by transistor structures of the first, third, and fifth anti-fuse bits, the fourth layout cell includes a third via region overlapping a third gate region shared by transistor structures of the second, fourth, and sixth anti-fuse bits, and a fourth via region overlapping a fourth gate region shared by anti-fuse structures of the second, fourth, and sixth anti-fuse bits, the third layout cell includes fifth and sixth via regions overlapping the first gate region, and the second layout cell includes seventh and eighth via regions overlapping the fourth gate region, and generating the IC layout diagram including the arrangement of the first through fourth layout cells.

In some embodiments, a method of operating an anti-fuse cell includes applying a first voltage to a program line electrically connected to a gate structure, the gate structure corresponding to each of four adjacent bit cell structures of the anti-fuse cell, and causing a bit cell current to flow through a bit line electrically connected to a first bit cell structure of the four bit cell structures of the anti-fuse cell. A magnitude of the bit cell current is based on a first voltage level of the first voltage and a current path between the program line and the gate structure, and the current path includes four vias between the program line and the gate structure, each of the four vias being adjacent to a bit cell structure of the four adjacent bit cell structures of the anti-fuse cell.

In some embodiments, a method of reading an anti-fuse cell includes applying a read voltage to a program line electrically connected to a gate structure, the gate structure corresponding to each of four adjacent bit cell structures of the anti-fuse cell, and applying a bit line voltage to a bit line electrically connected to a first bit cell structure of the four bit cell structures of the anti-fuse cell, thereby causing a bit cell current to flow through the bit line. A magnitude of the bit cell current is based on voltage levels of the read and bit line voltages and a current path between the program line and the gate structure, and the current path includes four vias between the program line and the gate structure, each of the four vias being adjacent to a bit cell structure of the four adjacent bit cell structures of the anti-fuse cell.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of generating an integrated circuit (IC) layout diagram, the method comprising:
    arranging first through fourth layout cells by:
        abutting the first and second layout cells, thereby defining a first active region corresponding to first and second anti-fuse bits; and
        abutting the third and fourth layout cells, thereby defining a second active region corresponding to third and fourth anti-fuse bits, wherein
            the arranging the first through fourth layout cells collectively defines a third active region corresponding to fifth and sixth anti-fuse bits adjacent to the first and second anti-fuse bits and to the third and fourth anti-fuse bits,
            the first layout cell comprises a first via region overlapping a first gate region shared by anti-fuse structures of the first, third, and fifth anti-fuse bits, and a second via region overlapping a second gate region shared by transistor structures of the first, third, and fifth anti-fuse bits,
            the fourth layout cell comprises a third via region overlapping a third gate region shared by transistor structures of the second, fourth, and sixth anti-fuse bits, and a fourth via region overlapping a fourth gate region shared by anti-fuse structures of the second, fourth, and sixth anti-fuse bits,
            the third layout cell comprises fifth and sixth via regions overlapping the first gate region, and
            the second layout cell comprises seventh and eighth via regions overlapping the fourth gate region; and
    generating the IC layout diagram comprising the arrangement of the first through fourth layout cells.

2. The method of claim 1, wherein
    the first through fourth layout cells comprise first through eighth conductive regions overlapping respective ones of the first through eighth via regions,
    the abutting the first and second layout cells comprises aligning the first conductive region with one of the seventh or eighth conductive regions, and aligning the second conductive region with the other of the seventh or eighth conductive regions, and
    the abutting the third and fourth layout cells comprises aligning the third conductive region with one of the fifth or sixth conductive regions, and aligning the fourth conductive region with the other of the fifth or sixth conductive regions.

3. The method of claim 2, wherein each of the aligning the second conductive region with the other of the seventh or eighth conductive regions and the aligning the fourth conductive region with the other of the fifth or sixth conductive regions comprises separating the corresponding conductive regions by a distance corresponding to a minimum spacing rule of an extreme ultraviolet (EUV) manufacturing process.

4. The method of claim 2, wherein
    the abutting the first and second layout cells further comprises overlapping the first gate region with each of the first and second conductive regions, overlapping the second gate region with the second conductive region, and overlapping the fourth gate region with each of the seventh and eighth conductive regions, and
    the abutting the third and fourth layout cells further comprises overlapping the first gate region with each of the fifth and sixth conductive regions, overlapping the third gate region with the fourth conductive region, and overlapping the fourth gate region with each of the third and fourth conductive regions.

5. The method of claim 1, wherein
    the arranging the first through fourth layout cells comprises arranging fifth through eighth layout cells by:
        abutting the fifth and sixth layout cells, thereby defining a fourth active region corresponding to seventh and eighth anti-fuse bits; and
        abutting the seventh and eighth layout cells, thereby defining a fifth active region corresponding to ninth and tenth anti-fuse bits,
    the arranging the fifth through eighth layout cells collectively defines a sixth active region corresponding to eleventh and twelfth anti-fuse bits adjacent to the seventh and eighth anti-fuse bits and to the ninth and tenth anti-fuse bits,
    the fifth layout cell comprises a ninth via region overlapping a fifth gate region shared by anti-fuse structures of the seventh, ninth, and eleventh anti-fuse bits, and a tenth via region overlapping a sixth gate region shared by transistor structures of the seventh, ninth, and eleventh anti-fuse bits,
    the eighth layout cell comprises an eleventh via region overlapping a seventh gate region shared by transistor structures of the eighth, tenth, and twelfth anti-fuse bits, and a twelfth via region overlapping an eighth gate region shared by anti-fuse structures of the eighth, tenth, and twelfth anti-fuse bits, the seventh layout cell comprises thirteenth and fourteenth via regions overlapping the fifth gate region, the sixth layout cell comprises fifteenth and sixteenth via regions overlapping the eighth gate region, and the generating the IC layout diagram comprises the IC layout diagram comprising the fifth through eighth layout cells aligned with the first through fourth layout cells.

6. The method of claim 5, wherein the fifth through eighth gate regions are same gate regions as the first through fourth gate regions, respectively, and the arranging the fifth through eighth layout cells comprises arranging the fifth and sixth layout cells adjacent to the third and fourth layout cells.

7. The method of claim 5, wherein the arranging the fifth through eighth layout cells comprises arranging the fifth and seventh layout cells adjacent to the second and fourth layout cells.

8. The method of claim 5, wherein the arranging the fifth through eighth layout cells comprises arranging the sixth and eighth layout cells adjacent to the second and fourth layout cells.

9. The method of claim 5, wherein the fifth through eighth gate regions are same gate regions as the first through fourth gate regions, respectively, and the arranging the fifth through eighth layout cells comprises arranging a ninth layout cell between the third and fifth layout cells and a tenth layout cell between the fourth and sixth layout cells.

10. The method of claim 1, wherein the arranging the first through fourth layout cells is part of arranging first and second rows of layout cells including the first through fourth layout cells, and the generating the IC layout diagram comprises the IC layout diagram including a pattern in which the first and second rows are repeated in groups of two or three rows of layout cells.

11. A method of operating an anti-fuse cell, the method comprising:

applying a first voltage to a program line electrically connected to a gate structure, the gate structure corresponding to each of four adjacent bit cell structures of the anti-fuse cell; and causing a bit cell current to flow through a bit line electrically connected to a first bit cell structure of the four bit cell structures of the anti-fuse cell, wherein a magnitude of the bit cell current is based on a first voltage level of the first voltage and a current path between the program line and the gate structure, and the current path comprises four vias between the program line and the gate structure, each of the four vias being adjacent to a bit cell structure of the four adjacent bit cell structures of the anti-fuse cell.

12. The method of claim 11, wherein the causing the bit cell current to flow through the bit line comprises applying a bit line voltage to the bit line, and the magnitude of the bit cell current is further based on a bit line voltage level of the bit line voltage.

13. The method of claim 11, wherein the applying the first voltage comprises the first voltage level being a program voltage as part of a programming operation.

14. The method of claim 11, wherein first and second vias of the four vias are positioned between adjacent bit cell structures of the four adjacent bit cell structures, and the four adjacent bit cell structures are positioned between the third and fourth vias of the four vias.

15. The method of claim 11, wherein each of the four adjacent bit cell structures of the anti-fuse cell is positioned in an active area shared with a bit cell structure of an adjacent anti-fuse cell, the current path further comprises four conductive segments overlying and electrically connected to corresponding ones of the four vias, and each of the four conductive segments is aligned with a conductive segment corresponding to the adjacent anti-fuse cell.

16. A method of reading an anti-fuse cell, the method comprising:

applying a read voltage to a program line electrically connected to a gate structure, the gate structure corresponding to each of four adjacent bit cell structures of the anti-fuse cell; and applying a bit line voltage to a bit line electrically connected to a first bit cell structure of the four bit cell structures of the anti-fuse cell, thereby causing a bit cell current to flow through the bit line, wherein a magnitude of the bit cell current is based on voltage levels of the read and bit line voltages and a current path between the program line and the gate structure, and the current path comprises four vias between the program line and the gate structure, each of the four vias being adjacent to a bit cell structure of the four adjacent bit cell structures of the anti-fuse cell.

17. The method of claim 16, wherein the causing the bit cell current to flow comprises applying a signal on a signal path comprising a fifth via adjacent to two bit cell structures of the four adjacent bit cell structures.

18. The method of claim 17, wherein the current path further comprises four conductive segments overlying and electrically connected to corresponding ones of the four vias, the signal path comprises a fifth conductive segment overlying and electrically connected to the fifth via, and each of the four adjacent bit cell structures is adjacent to two of the five conductive segments.

19. The method of claim 18, wherein each of the four adjacent bit cell structures of the anti-fuse cell is positioned in an active area shared with a bit cell structure of an adjacent anti-fuse cell, and each of the five conductive segments is aligned with a conductive segment corresponding to the adjacent anti-fuse cell.

20. The method of claim 16, further comprising sensing the bit cell current using a sense amplifier.

* * * * *